(12) United States Patent
Chen et al.

(10) Patent No.: US 11,906,902 B2
(45) Date of Patent: Feb. 20, 2024

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Tai-Yu Chen, Hsinchu (TW); Shang-Chieh Chien, New Taipei (TW); Sheng-Kang Yu, Hsinchu (TW); Li-Jui Chen, Hsinchu (TW); Heng-Hsin Liu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/655,708

(22) Filed: Mar. 21, 2022

(65) Prior Publication Data

US 2023/0038668 A1    Feb. 9, 2023

Related U.S. Application Data

(60) Provisional application No. 63/260,003, filed on Aug. 6, 2021.

(51) Int. Cl.
*G03F 7/00* (2006.01)
*H05G 2/00* (2006.01)

(52) U.S. Cl.
CPC ......... *G03F 7/70033* (2013.01); *H05G 2/008* (2013.01)

(58) Field of Classification Search
CPC ..... G03F 7/70033; H05G 2/008; A23L 33/17; A23V 2002/00; A23V 2200/332; A61K 38/16; A61K 38/39; A61P 3/04
See application file for complete search history.

(56) References Cited

U.S. PATENT DOCUMENTS

| | | | |
|---|---|---|---|
| 2006/0255298 A1* | 11/2006 | Bykanov | H05G 2/003 250/504 R |
| 2013/0077073 A1* | 3/2013 | Van Schoot | G03F 7/70558 355/67 |
| 2016/0073487 A1* | 3/2016 | Yanagida | H05G 2/006 250/504 R |
| 2017/0171955 A1* | 6/2017 | Ueno | H05H 15/00 |
| 2018/0317309 A1* | 11/2018 | Chang | H05G 2/008 |
| 2022/0192000 A1* | 6/2022 | Fomenkov | G03F 7/70033 |
| 2023/0049820 A1* | 2/2023 | Chen | G03F 7/70025 |

* cited by examiner

*Primary Examiner* — Deoram Persaud
(74) *Attorney, Agent, or Firm* — Harrity & Harrity, LLP

(57) ABSTRACT

Example implementations described herein include a laser source and associated methods of operation that can balance or reduce uneven beam profile problem and even improve plasma heating efficiency to enhance conversion efficiency and intensity for extreme ultraviolet radiation generation. The laser source described herein generates an auxiliary laser beam to augment a pre-pulse laser beam and/or a main-pulse laser beam, such that uneven beam profiles may be corrected and/or compensated. This may improve an intensity of the laser source and also improve an energy distribution from the laser source to a droplet of a target material, effective to increase an overall operating efficiency of the laser source.

20 Claims, 23 Drawing Sheets

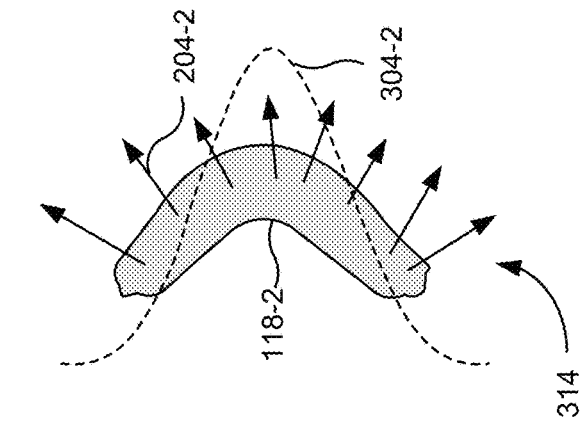
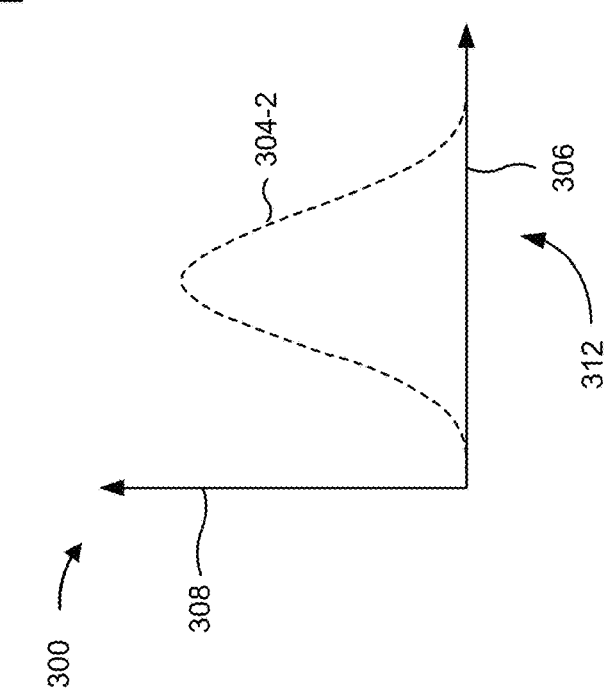
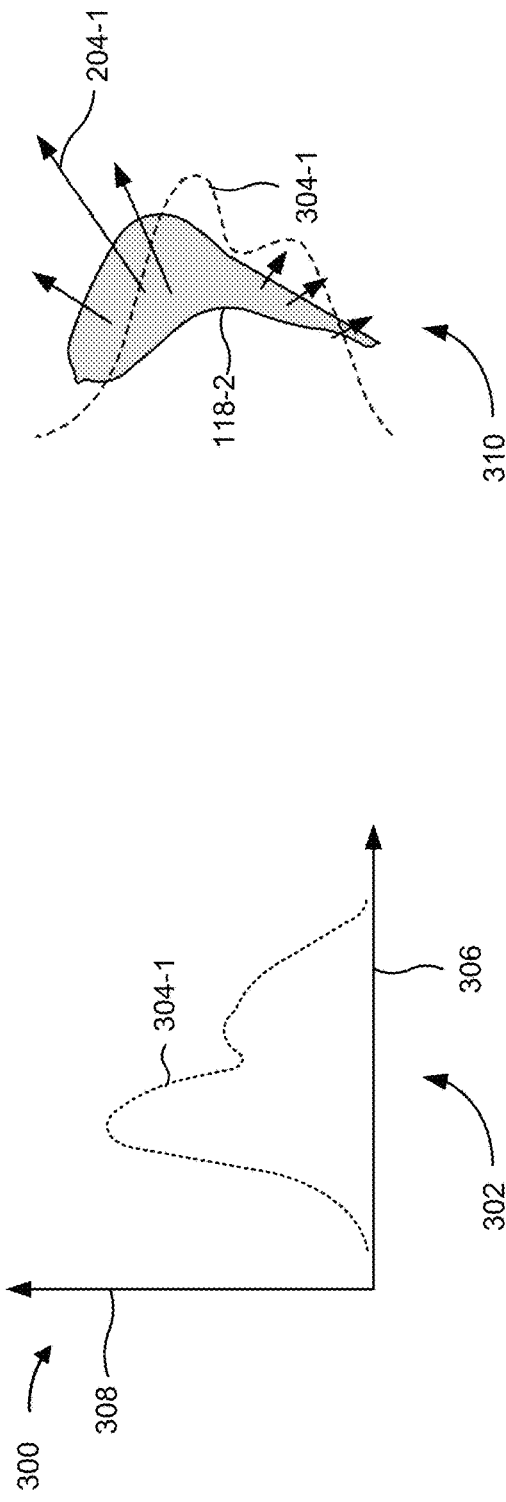
FIG. 3A
FIG. 3B

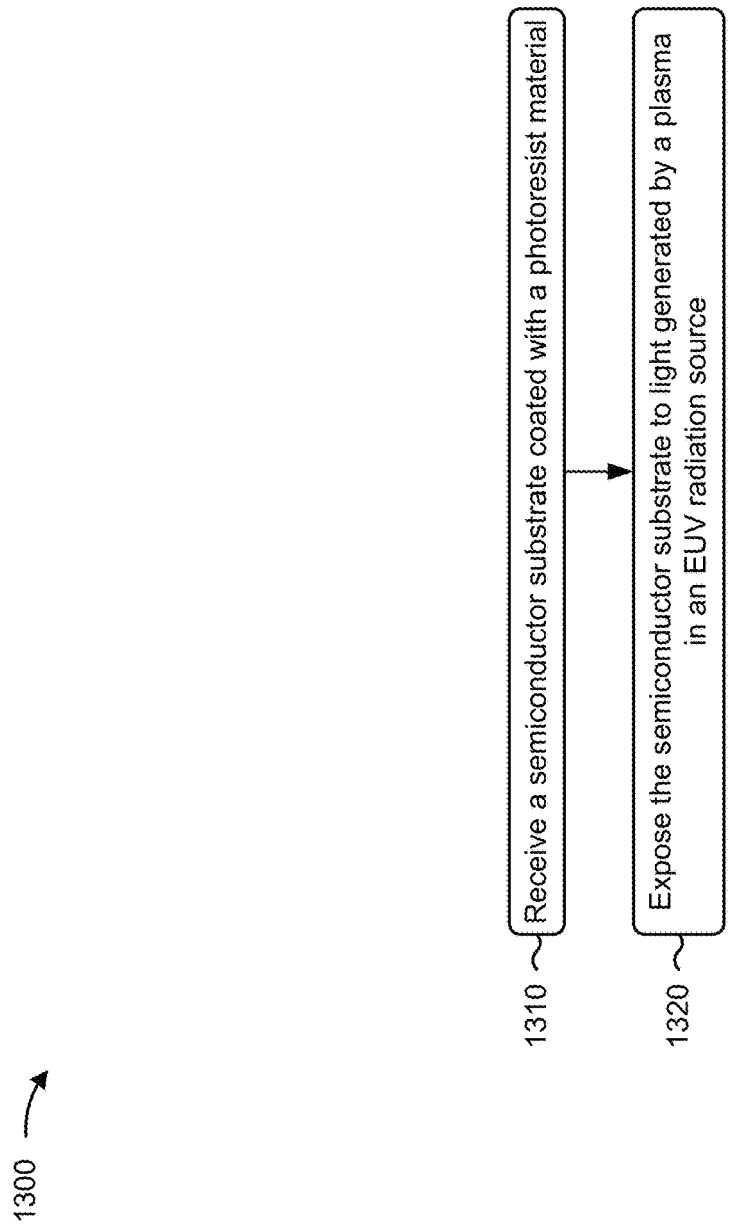

SEMICONDUCTOR PROCESSING TOOL AND METHODS OF OPERATION

CROSS-REFERENCE TO RELATED APPLICATION

This Patent Application claims priority to U.S. Provisional Patent Application No. 63/260,003 filed on Aug. 6, 2021, and entitled "SEMICONDUCTOR PROCESSING TOOL AND METHODS OF OPERATION." The disclosure of the prior Application is considered part of and is incorporated by reference into this Patent Application.

BACKGROUND

An extreme ultraviolet (EUV) radiation source includes a collector, which includes a curved mirror that is configured to collect EUV radiation and to focus the EUV radiation toward an intermediate focus near an intermediate focus cap (IF cap) of the EUV radiation source. The EUV radiation is produced from a laser produced plasma (LPP) that is generated by exposing droplets of tin (Sn) to a carbon dioxide ($CO_2$)-based laser. The Sn droplets are generated by a droplet generator (DG) head, which provides the Sn droplets into a scanner chamber to an irradiation site where the Sn droplets are irradiated by a focused laser beam.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C, 4A, and 4B are diagrams of example energy profiles described herein.

FIGS. 10-13 are flowcharts of example processes relating to generating and providing laser beams to a radiation source of a lithography system described herein.

DETAILED DESCRIPTION

Figure 1A:
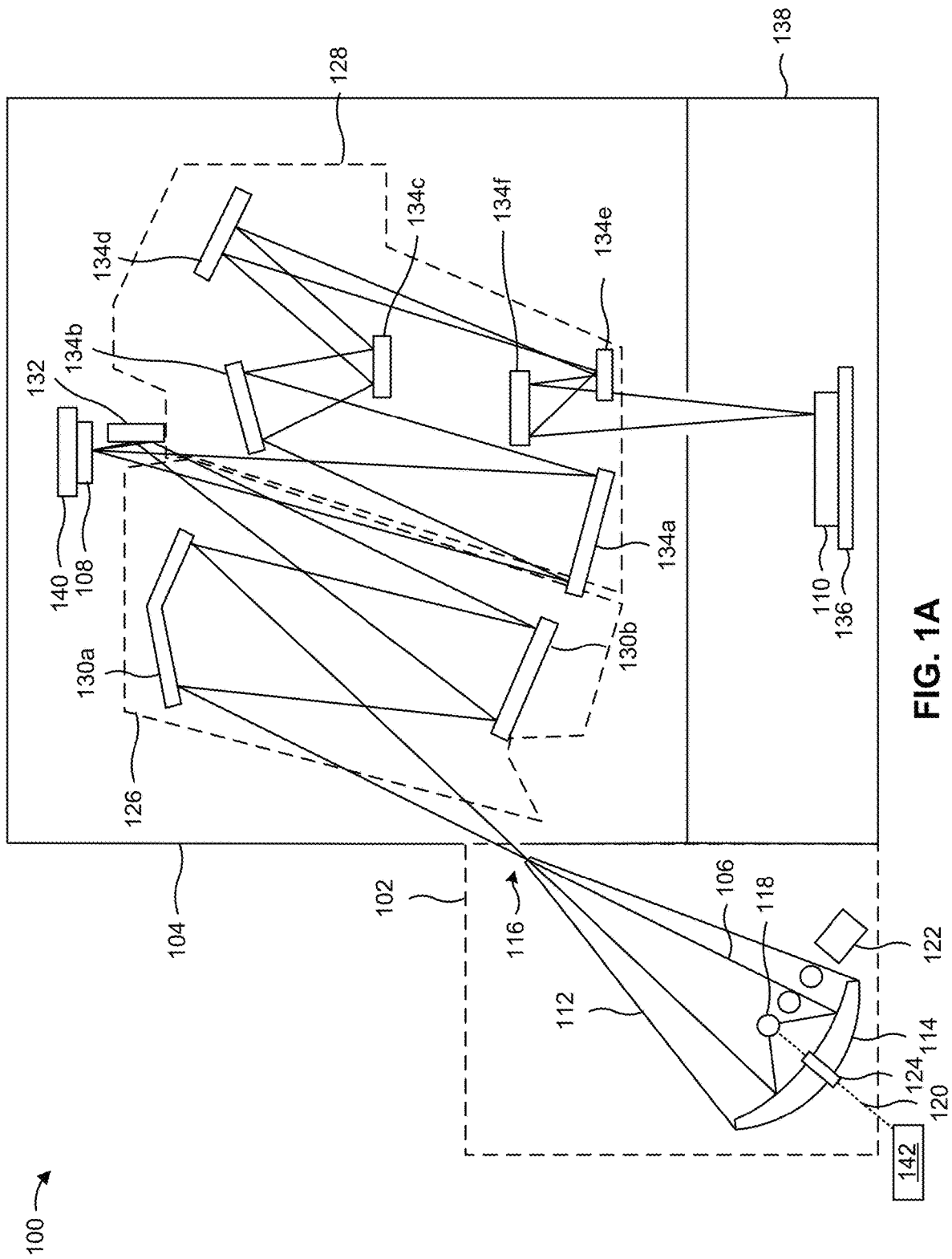
FIGS. 1A and 1B are diagrams of an example lithography system described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A laser source for an extreme ultraviolet (EUV) radiation source may generate laser beams using a multi-pulse technique (or a multi-stage pumping technique), in which the laser source generates a pre-pulse laser beam and main-pulse laser beam to achieve greater heating efficiency in tin (Sn)-based plasma to increase conversion efficiency. A carbon dioxide ($CO_2$)-based laser source is an example laser source that can provide high power and energy. Moreover, due to the wavelength of the laser beams generated by a $CO_2$-based laser source in an infrared (IR) region, the laser beams may have a high absorption rate in tin, which enables the $CO_2$-based laser source to achieve high power and energy for pumping tin-based plasma.

Laser produced plasma (LPP) may be generated from target material (e.g., Sn or another type of target material) droplets, which are shot into a vessel of the EUV radiation source from a droplet generator. The laser source generates and provides the pre-pulse laser beam toward a target material droplet, and the pre-pulse laser beam is absorbed by the target material droplet. This transforms the target material droplet into a disc shape or a mist. Subsequently, the laser source provides the main-pulse laser beam with large intensity and energy toward the disc-shaped target material or target material mist. Here, the atoms of the target material are neutralized, and ions are generated through thermal flux and shock wave. The main-pulse laser beam pumps ions to a higher charge state, which causes the ions to radiate EUV radiation (e.g., EUV light). The EUV radiation is collected at the collector surface and is directed into a chamber of an exposure tool to expose a semiconductor substrate.

In some cases, a laser source may generate a laser beam having a laser beam profile that is non-uniform or uneven (e.g., an energy-distribution profile that is non-Gaussian). The non-uniform laser beam profile may result in uneven spatial energy and/or temporal intensity distribution of the laser beam. Moreover, the laser source may provide low collimation and high divergence, which result in inefficiencies in the laser ablation process, and which result in wasted energy in the propagation of the laser beam.

As an example, a non-uniform laser beam profile may affect target material plasma generation. For example, a higher intensity region of a laser beam profile may accelerate the growing of the target material (which may increase electron temperature to enhance ion generation and EUV radiation generation), whereas a lower intensity region of the laser beam profile may provide insufficient heating that can cause target material debris formation, low vaporization, and low fragmentation. In long-term operation, complications can occur due to an uneven laser beam profile, such as laser targeting windows increasing (e.g., drifting), debris accumulation with uneven spatial distribution, EUV energy instability, and/or power management reduction during operation of a laser source, among other examples. Furthermore, and in some cases, the laser source may be subject to thermal effects (e.g., a "cold-to-hot" effect) that reduces laser output intensity as a temperature of the laser source increases. Such thermal effects may exacerbate the aforementioned complications.

Example implementations described herein include a laser source and associated methods of operation that can balance or reduce a non-uniform energy-distribution of a laser beam to improve plasma heating efficiency to enhance conversion efficiency and intensity for extreme ultraviolet radiation generation. The laser source described herein generates an auxiliary laser beam to augment a pre-pulse laser beam and/or a main-pulse laser beam, such that the non-uniform energy distribution of the laser beam can be corrected and/or compensated. This may improve an intensity of the laser source and also improve an energy distribution from the laser source to a droplet of a target material, which are effective to increase an overall operating efficiency of the laser source.

The laser source described herein reduces and/or minimizes drive laser spatial and temporal beam profile non-uniformities, improves timing and intensity of modulation, and reduces impact of thermal effects to improve output intensity of the laser source and an operating efficiency of the laser source. In aggregate, such improvements can increase throughput of a lithography system using the radiation source and increase a yield of semiconductor devices fabricated using such a lithography system.

Figure 1B:
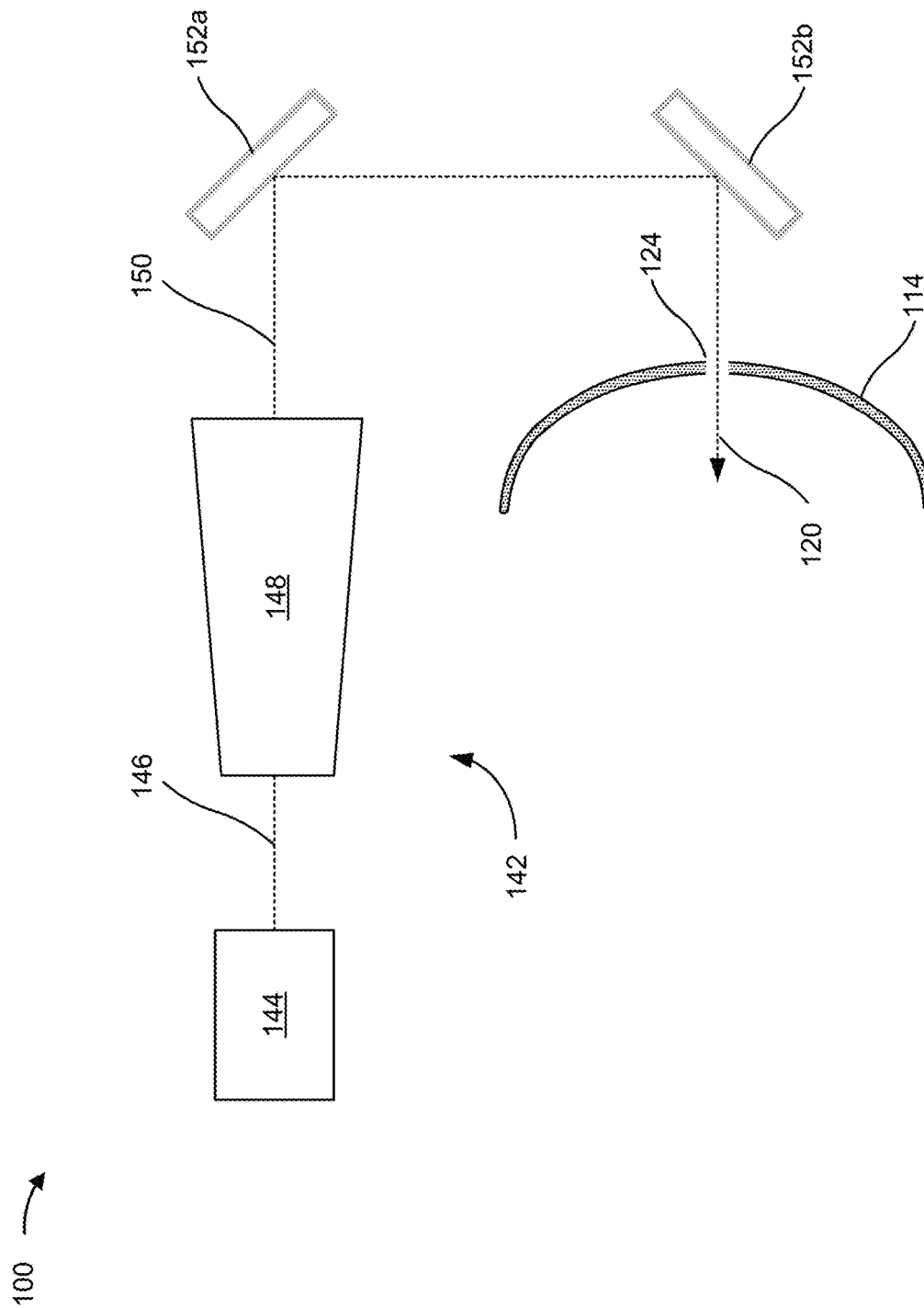

FIGS. 1A and 1B are diagrams of an example lithography system 100 described herein. The lithography system 100 includes an EUV lithography system or another type of lithography system that is configured to transfer a pattern to a semiconductor substrate using mirror-based optics. The lithography system 100 may be configured for use in a semiconductor processing environment such as a semiconductor foundry or a semiconductor fabrication facility.

As shown in FIG. 1A, the lithography system 100 includes a radiation source 102 and an exposure tool 104. The radiation source 102 (e.g., an EUV radiation source or another type of radiation source) is configured to generate radiation 106 such as EUV radiation and/or another type of electromagnetic radiation (e.g., light). The exposure tool 104 (e.g., an EUV scanner tool, and EUV exposure tool, or another type of exposure tool) is configured to focus the radiation 106 onto a reflective reticle 108 (or a photomask) such that a pattern is transferred from the reticle 108 onto a semiconductor substrate 110 using the radiation 106.

The radiation source 102 includes a vessel 112 and a collector 114 in the vessel 112. The collector 114, includes a curved mirror that is configured to collect the radiation 106 generated by the radiation source 102 and to focus the radiation 106 toward an intermediate focus 116. The radiation 106 is produced from a plasma that is generated from droplets 118 of a target material (e.g., droplets of a target material including Sn droplets or another type of droplets) of a target material being exposed to a laser beam 120. The droplets 118 are provided across the front of the collector 114 by a droplet generator (DG) 122. The droplet generator 122 is pressurized to provide a fine and controlled output of the droplets 118. The laser beam 120 is provided such that the laser beam 120 is focused through a window 124 of the collector 114. The laser beam 120 is focused onto the droplets 118 which generates the plasma. The plasma produces a plasma emission, some of which is the radiation 106.

The exposure tool 104 includes an illuminator 126 and a projection optics box (POB) 128. The illuminator 126 includes a plurality of reflective mirrors that are configured to focus and/or direct the radiation 106 onto the reticle 108 so as to illuminate the pattern on the reticle 108. The plurality of mirrors include, for example, a mirror 130*a* and a mirror 130*b*. The mirror 130*a* includes a field facet mirror (FFM) or another type of mirror that includes a plurality of field facets. The mirror 130*b* includes a pupil facet mirror (PFM) or another type of mirror that also includes a plurality of pupil facets. The facets of the mirrors 130*a* and 130*b* are arranged to focus, polarize, and/or otherwise tune the radiation 106 from the radiation source 102 to increase the uniformity of the radiation 106 and/or to increase particular types of radiation components (e.g., transverse electric (TE) polarized radiation, transverse magnetic (TM) polarized radiation). Another mirror 132 (e.g., a relay mirror) is included to direct radiation 106 from the illuminator 126 onto the reticle 108.

The projection optics box 128 includes a plurality of mirrors that are configured to project the radiation 106 onto the semiconductor substrate 110 after the radiation 106 is modified based on the pattern of the reticle 108. The plurality of reflective mirrors include, for example, mirrors 134*a*-134*f*. In some implementations, the mirrors 134*a*-134*f* are configured to focus or reduce the radiation 106 into an exposure field, which may include one or more die areas on the semiconductor substrate 110.

The exposure tool 104 includes a wafer stage 136 (or a substrate stage) configured to support the semiconductor substrate 110. Moreover, the wafer stage 136 is configured to move (or step) the semiconductor substrate 110 through a plurality of exposure fields as the radiation 106 transfers the pattern from the reticle 108 onto the semiconductor substrate 110. The wafer stage 136 is included in a bottom module 138 of the exposure tool 104. The bottom module 138 includes a removable subsystem of the exposure tool 104. The bottom module 138 may slide out of the exposure tool 104 and/or otherwise may be removed from the exposure tool 104 to enable cleaning and inspection of the wafer stage 136 and/or the components of the wafer stage 136. The bottom module 138 isolates the wafer stage 136 from other areas in the exposure tool 104 to reduce and/or minimize contamination of the semiconductor substrate 110. Moreover, the bottom module 138 may provide physical isolation for the wafer stage 136 by reducing the transfer of vibrations (e.g., vibrations in the semiconductor processing environment in which the lithography system 100 is located, vibrations in the lithography system 100 during operation of the lithography system 100) to the wafer stage 136 and, therefore, the semiconductor substrate 110. This reduces movement and/or disturbance of the semiconductor substrate 110, which reduces the likelihood that the vibrations may cause a pattern misalignment.

The exposure tool 104 also includes a reticle stage 140 that is configured to support and/or secure the reticle 108. Moreover, the reticle stage 140 is configured to move or slide the reticle through the radiation 106 such that the reticle 108 is scanned by the radiation 106. In this way, a pattern that is larger than the field or beam of the radiation 106 may be transferred to the semiconductor substrate 110.

The lithography system 100 includes a laser source 142. The laser source 142 is configured to generate one or more laser beams 120. The laser source 142 may include a $CO_2$-based laser source or another type of laser source. Due to the wavelength of the laser beams generated by a $CO_2$-based laser source in an IR region, the laser beams may be highly absorbed by tin, which enables the $CO_2$-based laser source to achieve high power and energy for pumping tin-based plasma. In some implementations, the laser beam 120 includes a plurality of types of laser beams that the laser source 142 generates using a multi-pulse technique (or a multi-stage pumping technique), in which the laser source 142 generates a pre-pulse laser beam and a main-pulse laser beam.

In some implementations, the laser source 142 also generate an auxiliary laser beam. The auxiliary laser beam, which may include a pulse wave laser beam or a continuous wave laser beam, may combine with the pre-pulse laser beam and/or the main-pulse laser beam to achieve greater heating efficiency of tin (Sn)-based plasma and increase conversion efficiency. The auxiliary laser beam may include different properties than the pre-pulse laser beam or the main-pulse laser beam (e.g. a different wavelength, a different intensity, a different energy, a different polarization, or a different coherence, among other examples).

As described in greater detail herein, the laser source 142 may perform a combination of operations to deform the droplet 118 (e.g., deform the droplet 118 into a disc shape or a mist using a pre-pulse laser beam) and pump ions of the droplet 118 to a higher charge state (e.g., pump ions of the droplet 118, after deformation, using a main-pulse laser beam), which causes the ions to radiate the radiation 106 (e.g., EUV light).

The radiation 106 is collected by the collector 114 and directed out of the vessel 112 and into the exposure tool 104 toward the mirror 130a of the illuminator 126. The mirror 130a reflects the radiation 106 onto the mirror 130b, which reflects the radiation 106 onto the mirror 132 toward the reticle 108. The radiation 106 is modified by the pattern in the reticle 108. In other words, the radiation 106 reflects off of the reticle 108 based on the pattern of the reticle 108. The reflective reticle 108 directs the radiation 06 toward the mirror 134a in the projection optics box 128, which reflects the radiation 106 onto the mirror 134b. The radiation 106 continues to be reflected and reduced in the projection optics box 128 by the mirrors 134c-134f. The mirror 134f reflects the radiation 106 onto the semiconductor substrate 110 such that the pattern of the reticle 108 is transferred to the semiconductor substrate 110. The above-described exposure operation is an example, and the lithography system 100 may operate according to other EUV techniques and radiation paths that include a greater quantity of mirrors, a lesser quantity of mirrors, and/or a different configuration of mirrors.

FIG. 1B is a diagram of an example laser source 142 described herein for use in the lithography system 100 of FIG. 1A. The laser source 142 is configurable to generate and provide the laser beam 120 to a radiation source (e.g., the radiation source 102) through the window 124 of the collector 114 for EUV radiation generation. As described in connection with FIG. 2 and elsewhere herein, the laser source 142 may be configured to provide a pre-pulse laser beam and a main-pulse laser beam to the radiation source 102. The pre-pulse laser beam may generate a deformed droplet (e.g., apply energy to the droplet 118 to deform the droplet 118) within a vessel of the radiation source (e.g., the vessel 112), while the main-pulse laser beam may generate a plasma from the deformed droplet.

As shown in FIG. 1B, the laser source 142 includes a seed laser 144 (e.g., a drive laser). The seed laser 144 includes a semiconductor laser driver (e.g., a quantum dot laser driver, a diode laser driver), a resonator (or resonation chamber), an oscillator, a laser mode actuator or controller, and/or another component that is configured to generate a seed laser beam 146. The seed laser beam 146 is provided to an amplifier chain 148, which may include one or more laser amplifiers. The one or more laser amplifiers may include a preamplifier, a main amplifier, and/or another type of amplifier that is configured to amplify the seed laser beam 146 to form a laser output 150.

In some implementations, the laser source 142 includes one or more other components, including, an optical component (e.g., a filter) configured to select a particular wavelength for the seed laser beam 146 and/or adjust or modify other parameters of the seed laser beam 146. In some implementations, the laser source 142 includes an optical component (e.g., a beam splitter) that splits and/or rotates portions of the laser output 150 into two or more laser beams (e.g., two or more portions of the laser beam 120, including portions having energy-distribution profiles that are rotated or inverted in relation to an energy-distribution profile of the laser output 150). The laser beam 120 may be provided to the radiation source 102 by one or more mirrors 152, including mirror 152a and mirror 152b, among other examples. The mirrors 152 may include a concave or a convex shape, may include a multi-layer mirror, or may include one or more facets, among other examples. The mirrors 152 are arranged to focus and/or otherwise direct the laser beam 120 to a pointing location (e.g., a target location or intercept point) for the laser beam 120 irradiate a droplet of a target material (e.g., the droplet 118). In some implementations, the laser source 142 includes a greater or a lesser quantity of mirrors 152.

As indicated above, FIGS. 1A and 1B are provided as examples. Other examples may differ from what is described with regard to FIGS. 1A and 1B. For example, another example may include additional components, fewer components, different components, or differently arranged components than those shown in FIGS. 1A and 1B. Additionally, or alternatively, a set of components (e.g., one or more components) of FIGS. 1A and 1B may perform one or more functions described herein as being performed by another set of components.

Figure 2:
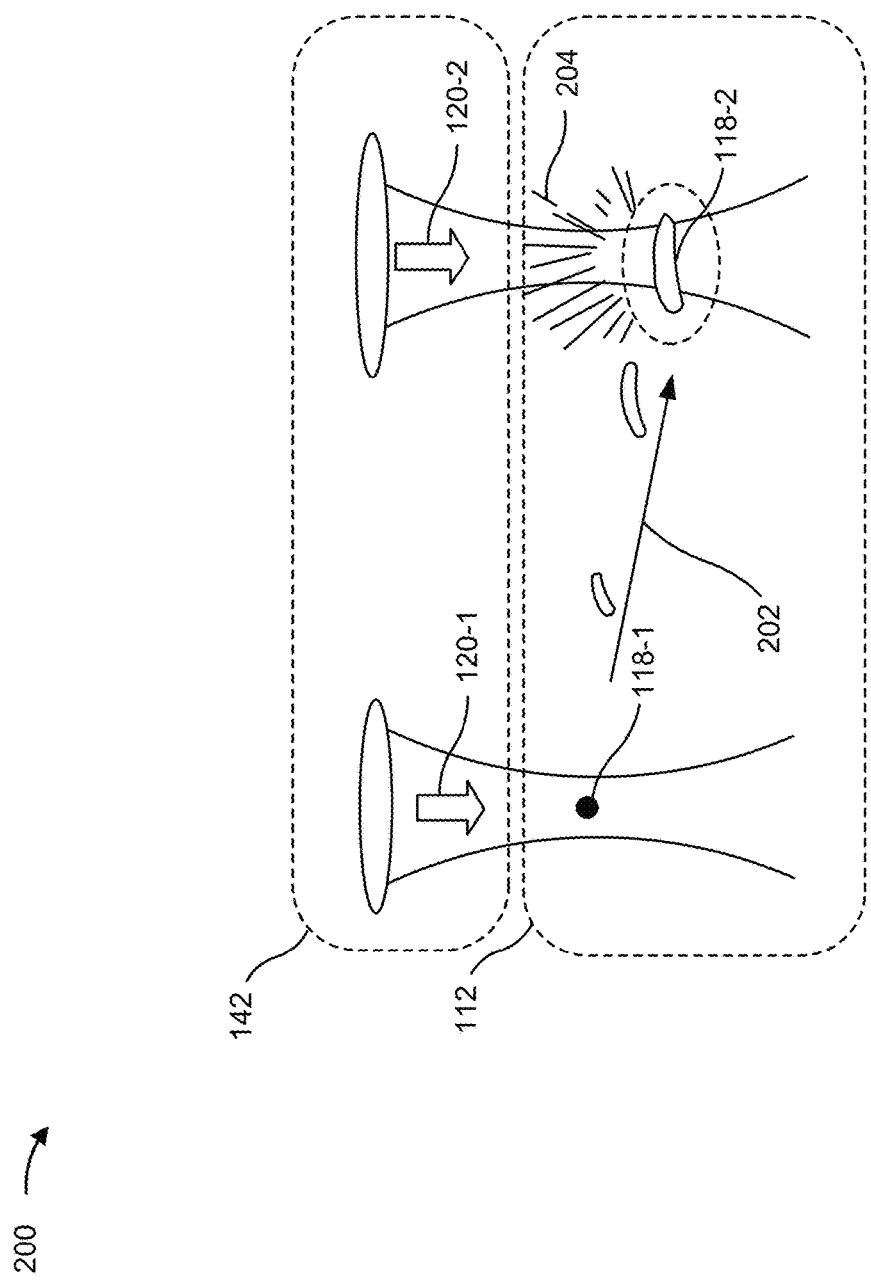
FIG. 2 is a diagram of an example implementation of a pre-pulse laser beam and a main-pulse laser beam described herein.

FIG. 2 is a diagram of an example implementation 200 of a pre-pulse laser beam 120-1 and a main-pulse laser beam 120-2 described herein. In the example implementation 200, the laser source 142 uses a multi-pulse technique (or a multi-stage pumping technique) to generate the pre-pulse laser beam 120-1 and the main-pulse laser beam 120-2 to achieve greater heating efficiency of droplets of a target material to increase conversion efficiency.

In some implementations, and as shown in FIG. 2, at a first location within the vessel 112, the pre-pulse laser beam 120-1 provides a first amount of energy to a droplet 118-1 of the target material. As an example, the droplet 118-1 of the target material may have a diameter of approximately 20 to approximately 30 microns. However, other values for the diameter are within the scope of the present disclosure. The energy transforms the droplet 118-1 to a deformed droplet 118-2. The deformed droplet 118-2 may include a disc shape, a "pancake" shape, a mist, or another shape. The deformed droplet 118-2 includes a greater surface area for excitation by the main-pulse laser beam 120-2 relative to the droplet 118-1, which increases the conversion rate of the target material to a plasma. Within the vessel 112, the deformed droplet 118-2 traverses a path 202 that brings the deformed droplet to a second location within the vessel 112. At the second location, the main-pulse laser beam 120-2 provides a second amount of energy to the droplet 118-2 to create a plasma 204 that generates EUV radiation as the plasma 204 dissipates.

In some implementations, timing of pulsing of laser beams from the pre-pulse laser beam 120-1 and the main-pulse laser beam 120-2 is dependent on a velocity of the deformed droplet 118-2, the size of the deformed droplet 118-2, the shape of the deformed droplet 118-2, the path of travel of the deformed droplet 118-2, and/or another parameter. As an example, the deformed droplet 118-2 may traverse the path 202 at a rate of approximately 80 meters per second, in which case timing of the pulsing of the main-pulse laser beam 120-2 may be offset from (e.g., lag behind) the pulse of the pre-pulse laser beam 120-1 by approximately 3000 microseconds. However, other values for the rate of travel of the deformed droplet 118-2 and other values for the timing or offset between the pre-pulse laser beam 120-1 and the main-pulse laser beam 120-2 are within the scope of the present disclosure.

As described in connection with FIGS. 3A-3C and elsewhere herein, the laser source 142 may generate and use an auxiliary laser beam. The auxiliary laser beam includes a laser beam that is combinable with the pre-pulse laser beam 120-1 or the main-pulse laser beam 120-2 to improve uniformity of the pre-pulse laser beam 120-1 or the main-pulse laser beam 120-2. The uniformity may include a spatial distribution uniformity, a temporal uniformity, or another type of uniformity. In some implementations, increasing the uniformity of the pre-pulse laser beam 120-1 and/or the main-pulse laser beam 120-2 increases a plasma heating efficiency to enhance a and an intensity of EUV radiation (e.g., light) generation.

Furthermore, and as described in connection with FIG. 4A and FIG. 4B and elsewhere herein, the laser source 142 may use the auxiliary laser beam to mitigate thermal effects (e.g., intensity degradation characteristics) of the laser source 142 that provides the pre-pulse laser beam 120-1 and/or the main-pulse laser beam 120-2. The mitigation of the thermal effects may improve efficiency of a lithography system (e.g., the lithography system 100) including the laser source 142 and increase yield of semiconductor products (e.g., increase yield of integrated circuit devices formed on semiconductor wafers) manufactured using the lithography system.

As indicated above, FIG. 2 is provided as an example. Other examples may differ from what is described with regard to FIG. 2.

Figure 3C:
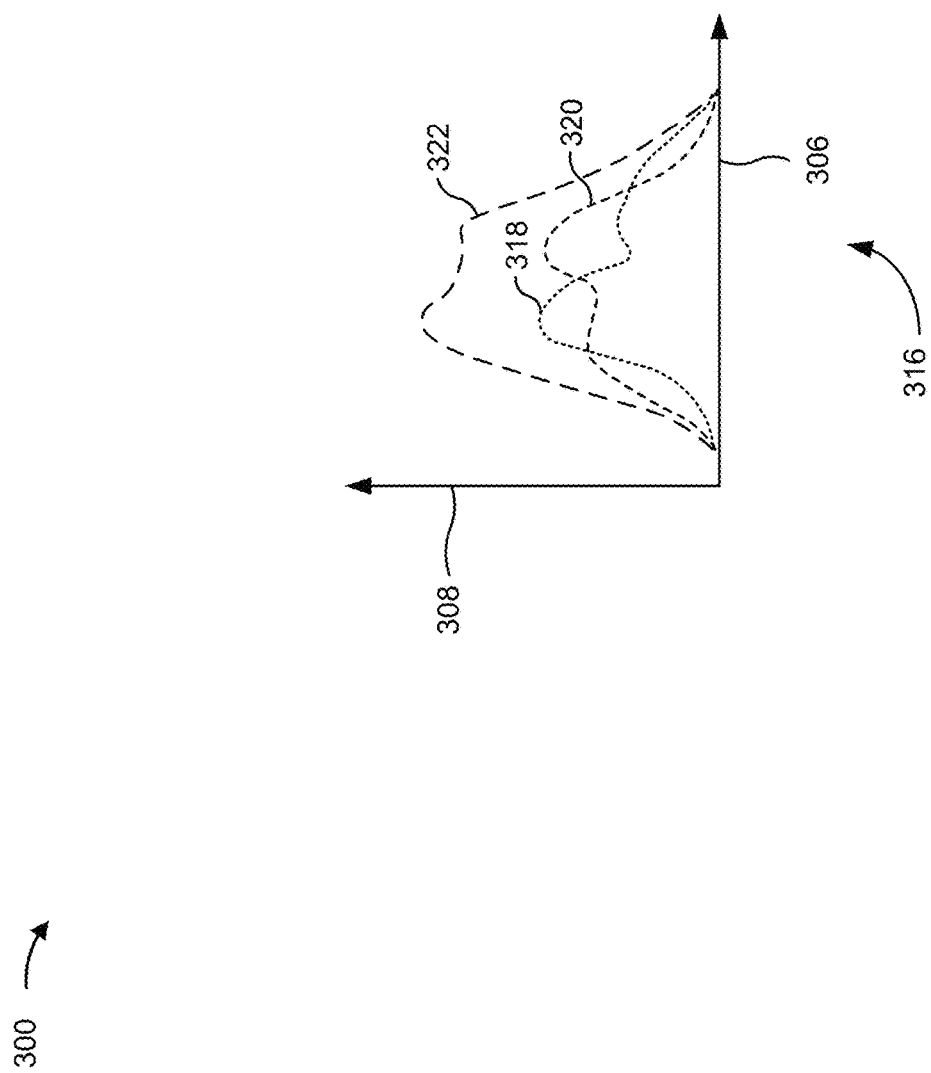

FIGS. 3A-3C are diagrams of example energy profiles 300 described herein. A pre-pulse laser beam (e.g., the pre-pulse laser beam 120-1) or a main-pulse laser beam (e.g., the main-pulse laser beam 120-2) may include one or more properties corresponding to the energy-distribution profiles. Furthermore, and in connection with FIG. 3C, a combination of energy-distribution profiles, including an energy-distribution profile of the auxiliary laser beam that complements the energy-distribution profiles of the pre-pulse laser beam or the main-pulse laser beam, is described.

FIG. 3A shows an example 302 of a non-uniform spatial energy-distribution profile 304-1 across a position domain 306 (e.g., a location in micrometers (μm), among other examples) versus an intensity domain 308 (an intensity in watts per centimeter squared (W/cm²) or an ion kinetic energy in kiloelectronvolts (keV), among other examples). The non-uniform spatial energy-distribution profile 304-1 represents a non-uniform (e.g., a "non-Gaussian") intensity distribution of a laser provided to a droplet of a target material (e.g., the droplet 118-1 or the deformed droplet 118-2, among other examples) at different positions across an axis traversing the droplet. A degree of non-uniformity may be quantified using one or more measures such as a mean, a standard deviation, a variance, or a skewness. The degree of non-uniformity may also be quantified in terms of asymmetric properties of the non-uniform spatial energy-distribution profile 304-1, among other examples.

The example 310 of FIG. 3A further shows an impact of a laser beam having the non-uniform spatial energy-distribution profile 304-1 with the deformed droplet 118-2 of the target material. Pre-pulsing another droplet (e.g., pre-pulsing the droplet 118-1) with a laser beam (e.g., the pre-pulse laser beam 120-1) with a spatial energy-distribution profile similar to the non-uniform spatial energy-distribution profile 304-1 (e.g., a non-uniform spatial energy-distribution profile) may generate the deformed droplet 118-2 to have a non-uniform deformation distribution as shown.

As shown in example 310, a laser beam (e.g., the main-pulse laser beam 120-2) with the non-uniform spatial energy-distribution profile 304-1 pulses the deformed droplet 118-2. Due to the distribution of energy associated with the non-uniform spatial energy-distribution profile 304-1, properties (e.g., ion energy, vaporization, or debris formation, among other examples) associated with a plasma 204-1 (e.g., a non-uniform plasma) emitted from the deformed droplet 118-2 may be non-uniform. As such, and in the example 310, a conversion efficiency may be relatively low in comparison to a case where the deformed droplet 118-2 includes a more uniform deformation distribution or a case where a spatial energy-distribution profile of the laser beam pulsing the deformed droplet 118-2 has improved uniformity.

FIG. 3B shows an example 312 of a uniform spatial energy-distribution profile 304-2 across the position domain 306 versus the intensity domain 308. In contrast to the non-uniform spatial energy-distribution profile 304-1 of FIG. 3A, the uniform spatial energy-distribution profile 304-2 of FIG. 3B represents a uniform (e.g., a "Gaussian") intensity distribution of a laser provided to a droplet of a target material (e.g., the droplet 118-1 or the deformed droplet 118-2 as shown, among other examples) at different positions (e.g., locations) of the droplet. A degree of uniformity may be quantified using one or more measures such as a mean, a standard deviation, a variance, or a skewness. The degree of uniformity may also be quantified in terms of symmetric properties of the uniform spatial energy-distribution profile 304-2, among other examples.

The example 314 of FIG. 3B shows an impact of a laser beam having the uniform spatial energy-distribution profile 304-2 with the deformed droplet 118-2 of the target material. Pre-pulsing a droplet (e.g., pre-pulsing the droplet 118-1) with a laser beam (e.g., the pre-pulse laser beam 120-1) with a spatial energy-distribution profile similar to the uniform spatial energy-distribution profile 304-2 (e.g., a uniform spatial energy-distribution profile) may generate the deformed droplet 118-2 to have a uniform deformation distribution as shown.

As shown in example 314, the deformed droplet 118-2 is being pulsed by a laser beam (e.g., the main-pulse laser beam 120-2) with the uniform spatial energy-distribution profile 304-2. Due to the uniform spatial energy-distribution profile 304-2 being uniform, properties (e.g., ion energy, vaporization, or debris formation, among other examples) associated with a plasma 204-2 (e.g., a uniform plasma) emitted from the deformed droplet 118-2 may be uniform. As such, and in the example 314, a conversion efficiency may be relatively greater in comparison to a case where the deformed droplet 118-2 includes a less uniform deformation distribution or a case where a spatial energy-distribution profile of the laser beam is less uniform than the uniform spatial energy-distribution profile 304-2.

FIG. 3C shows an example combining of an auxiliary laser beam with a pre-pulse or main-pulse laser beam to increase a spatial distribution uniformity of a spatial energy-distribution profile. Spatial energy-distribution profiles shown in FIG. 3C may be associated with the position domain 306 and the intensity domain 308.

As shown in example 316 of FIG. 3C, a primary laser (e.g., a primary laser for a pre-pulse laser or a main-pulse laser) may include or may generate a primary laser beam with a primary spatial energy-distribution profile 318 (e.g., a spatial energy-distribution profile of a primary main-pulse laser beam or a primary pre-pulse laser beam). An auxiliary laser may include or generate an auxiliary laser beam with an auxiliary spatial energy-distribution profile 320 (e.g., a spatial energy-distribution profile of an auxiliary main-pulse laser beam or an auxiliary pre-pulse laser beam). As shown in FIG. 3C, combining the primary spatial energy-distribution profile 318 and the auxiliary spatial energy-distribution profile 320 results in an increased spatial energy distribution for the combined spatial energy-distribution profile 322 relative to the primary spatial energy-distribution profile 318. The spatial energy-distribution profile 322 may be substantially uniform and include properties that are more symmetric than either the auxiliary spatial energy-distribution profile 320 or the primary spatial energy-distribution profile 318.

As indicated above, FIGS. 3A-3C are provided as examples. Other examples may differ from what is described with regard to FIGS. 3A-3C.

Figure 4A:
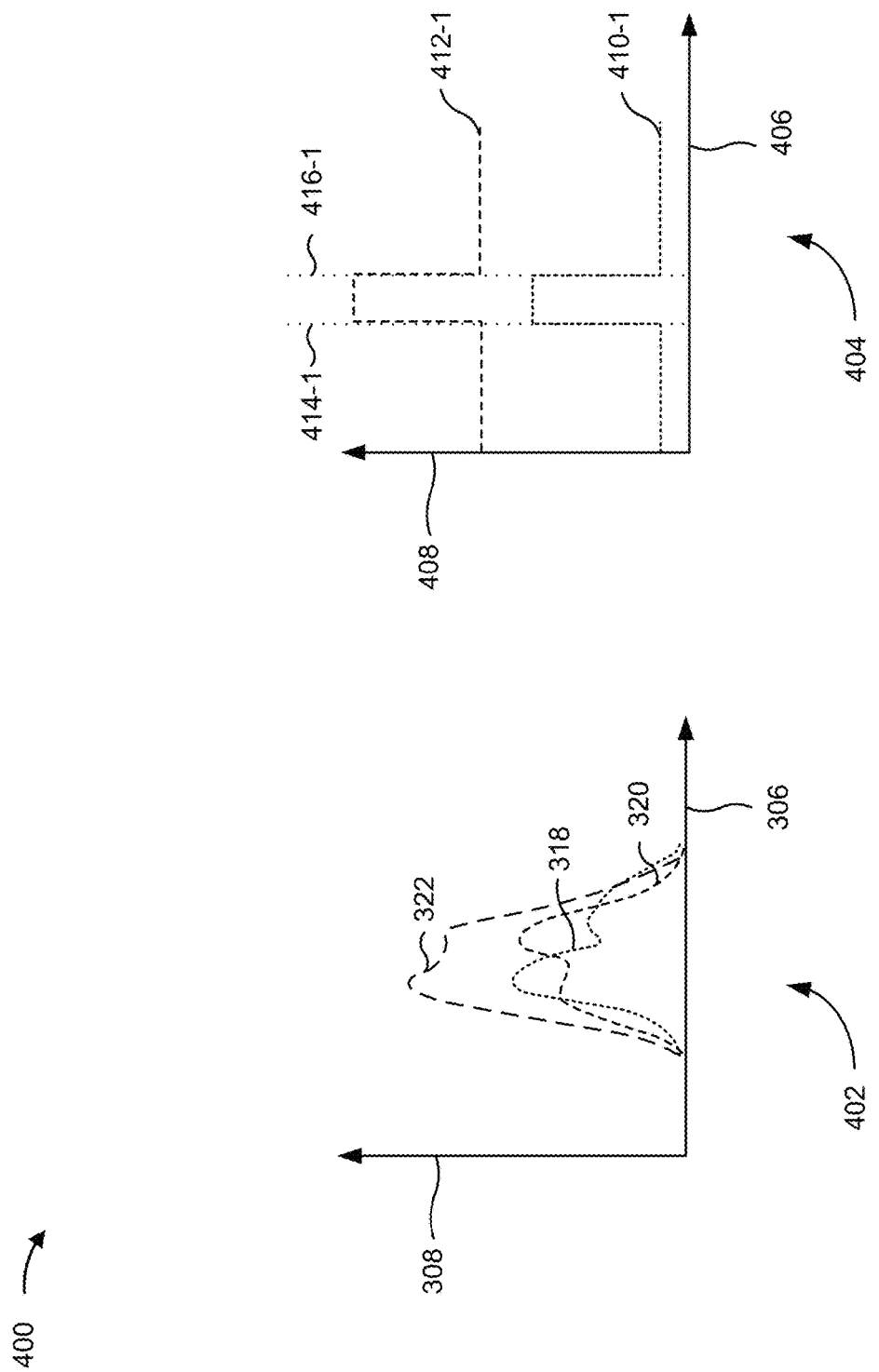
Figure 4B:
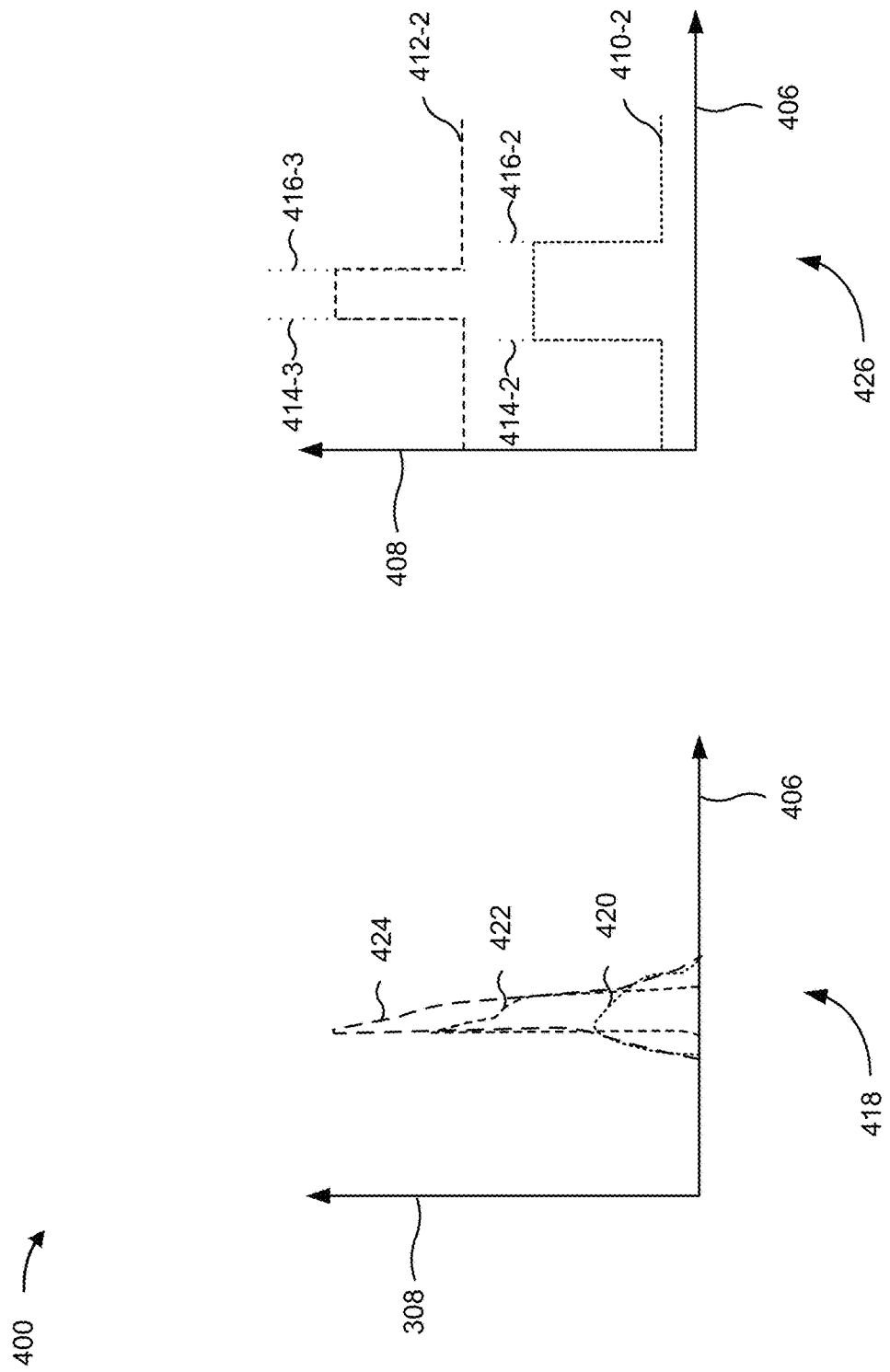

FIG. 4A and FIG. 4B are diagrams of example energy profiles 400 described herein. A primary laser beam (e.g., the pre-pulse laser beam 120-1 or the main-pulse laser beam 120-2), or an auxiliary laser beam described herein, may include one or more properties corresponding to the energy profiles 400.

Example 402 of FIG. 4A shows the primary spatial energy-distribution profile 318, the auxiliary spatial energy-distribution profile 320, and the combined spatial energy-distribution profile 322 in the context of the position domain 306 versus the intensity domain 308. Example timing parameters 404 of FIG. 4A shows example signaling in the context of a time domain 406 versus a signal gate domain 408 (e.g., a digital signal from a controller to activate and/or deactivate the seed laser 144 and the amplifier chain 148 associated with a pre-pulse laser source, a main-pulse laser source, or an auxiliary-pulse laser source, among other examples).

As shown, a primary laser signal 410-1 (e.g., a digital signal to toggle operation of a primary laser having the primary spatial energy-distribution profile 318) and an auxiliary laser signal 412-1 (e.g., another digital signal to toggle operation of an auxiliary laser having the auxiliary spatial energy-distribution profile 320) have timing parameters to activate sources of the primary laser beam and the auxiliary laser beam at a same approximate time 414-1. Similarly, the primary laser signal 410-1 and the auxiliary laser signal 412-1 have timing parameters to deactivate the sources of the primary laser beam and the auxiliary laser beam time at the same approximate time 416-1.

A primary laser source may include or may generate a primary pre-pulse laser beam or a primary main-pulse laser beam. An auxiliary laser source may include or may generate an auxiliary pre-pulse laser beam or an auxiliary main-pulse laser beam. Laser beams from the primary laser source and the auxiliary laser source may be combined based on timing alignment of the primary laser signal 410-1 and the auxiliary laser signal 412-1. As a result, laser beams including the primary spatial energy-distribution profile 318 and the auxiliary spatial energy-distribution profile 320 may be combined to generate the combined spatial energy-distribution profile 322. As shown in FIG. 4A, the combined spatial energy-distribution profile 322 includes an increased spatial energy distribution profile relative to the primary spatial energy-distribution profile 318 and/or the auxiliary spatial energy-distribution profile 320.

Turning to FIG. 4B, example 418 shows a primary temporal energy-intensity profile 420, an auxiliary temporal energy-intensity profile 422, and a combined temporal energy-intensity profile 424 in the context of the time domain 406 versus the intensity domain 308. Each of the temporal energy-intensity profiles may quantify an average emitted intensity of a laser (e.g., an average intensity across a spatial energy-distribution of the laser) across a duration of time.

Example timing parameters 426 of FIG. 4B show example signaling in the context of a time domain 406 versus a signal gate domain 408 (e.g., a digital signal to activate and/or deactivate the seed laser 144 and the amplifier chain 148 associated with a pre-pulse laser source, a main-pulse laser source, or an auxiliary pulse laser source, among other examples). As shown, timing parameters of a primary laser signal 410-2 include an activation time 414-2 and a deactivation time 416-2.

In contrast to example 404 of FIG. 4A, and as shown by example 426 of FIG. 4B, timing parameters of the auxiliary laser signal 412-2 are different from the timing parameters of the primary laser signal 410-2. As shown, timing parameters of the auxiliary laser signal 412-2 include an activation time 414-3 (e.g., an activation time that is different than the activation time 414-2 of the primary laser signal 410-2) and a deactivation time 416-3 (e.g., a deactivation time that is different than the deactivation time 416-2 of the primary laser signal 410-2). A primary laser beam including the primary temporal energy-intensity profile 420 may be combined with an auxiliary laser beam including the auxiliary temporal energy-intensity profile 422, which results in the combined temporal energy-intensity profile 424.

A controller or another device, as described in connection with FIGS. 7 and 9, may select parameters for laser signaling based on the spatial energy-distribution profile of a laser beam and/or the temporal energy-distribution profile of the laser beam. In some implementations, timing parameters associated with a primary laser beam (e.g., a laser beam having the primary spatial energy-distribution profile 318) and an auxiliary laser beam (e.g., a laser beam having the auxiliary spatial energy-distribution profile 320) are selected to shape a combined spatial energy-distribution profile (e.g., the combined spatial energy-distribution profile 322) over a particular time duration. Shaping the combined spatial energy-distribution profile may increase uniformity of distribution of energy from the primary laser beam and the auxiliary laser beam to a droplet of a target material (e.g., the droplet 118-1 or the deformed droplet 118-2, among other examples) to enhance an ionization rate to increase plasma conversion efficiency. Alternatively or in addition, shaping the combined spatial energy-distribution profile may increase a temporal peak intensity to enhance an ionization rate to increase plasma conversion efficiency.

As indicated above, FIGS. 4A and 4B are provided as examples. Other examples may differ from what is described with regard to FIGS. 4A and 4B.

FIGS. 5A-5F are diagrams of example implementations 500 described herein. The example implementations 500 include respective combinations of laser sources and laser amplifier chains (e.g., different combinations of the seed laser 144 and the amplifier chain 148 of FIG. 1B) that generate different laser outputs to be used for a pre-pulse laser beam (e.g., the pre-pulse laser beam 120-1) and a main-pulse laser beam (e.g., the main-pulse laser beam 120-2). The example implementations 500 further include one or more additional components to generate an auxiliary laser beam which, based on a selected implementation, is combinable with one or more of the main-pulse laser beam or the pre-pulse laser beam. Although not included in FIGS. 5A-5F for clarity purposes, some implementations of FIGS. 5A-5F include one or more of the mirrors of FIG. 1B (e.g., the mirror 152a and/or the mirror 152b, among other examples).

As described in connection to FIGS. 5A-5F and elsewhere herein, some implementations include a laser source (e.g., the laser source 142) generating a pre-pulse laser beam and providing, to an EUV radiation source (e.g., the radiation source 102), the pre-pulse laser beam to generate a deformed droplet (e.g., the deformed droplet 118-2) from a droplet (e.g., the droplet 118-1) of a target material in a vessel (e.g., the vessel 112) of the EUV radiation source. Such implementations include generating a main-pulse laser beam having a first energy-distribution profile and generating an auxiliary laser beam having a second energy-distribution profile. The second energy-distribution profile is based on the first energy-distribution profile to achieve a target energy-distribution profile for a combination of the main-pulse laser beam and the auxiliary laser beam. Such implementations also include providing, to the EUV radiation source, the main-pulse laser beam and the auxiliary laser beam to generate a plasma (e.g., the plasma 204) from the deformed droplet in the vessel of the EUV radiation source.

Some implementations include a laser source (e.g., the laser source 142) generating a pre-pulse laser beam having a first energy-distribution profile and generating an auxiliary laser beam having a second energy-distribution profile. The second energy-distribution profile is based on the first energy-distribution profile to achieve a target energy-distribution profile for a combination of the pre-pulse laser beam and the auxiliary laser beam. Such implementations include providing, to an EUV radiation source (e.g., the radiation source 102), the pre-pulse laser beam and the auxiliary laser beam to generate a deformed droplet (e.g., the deformed droplet 118-2) from a droplet (e.g., the droplet 118-1) of a target material in a vessel (e.g., the vessel 112) of the EUV radiation source. Such implementations also include generating a main-pulse laser beam and providing, to the EUV radiation source, the main-pulse laser beam to generate a plasma from the deformed droplet in the vessel of the EUV radiation source.

Figure 5A:
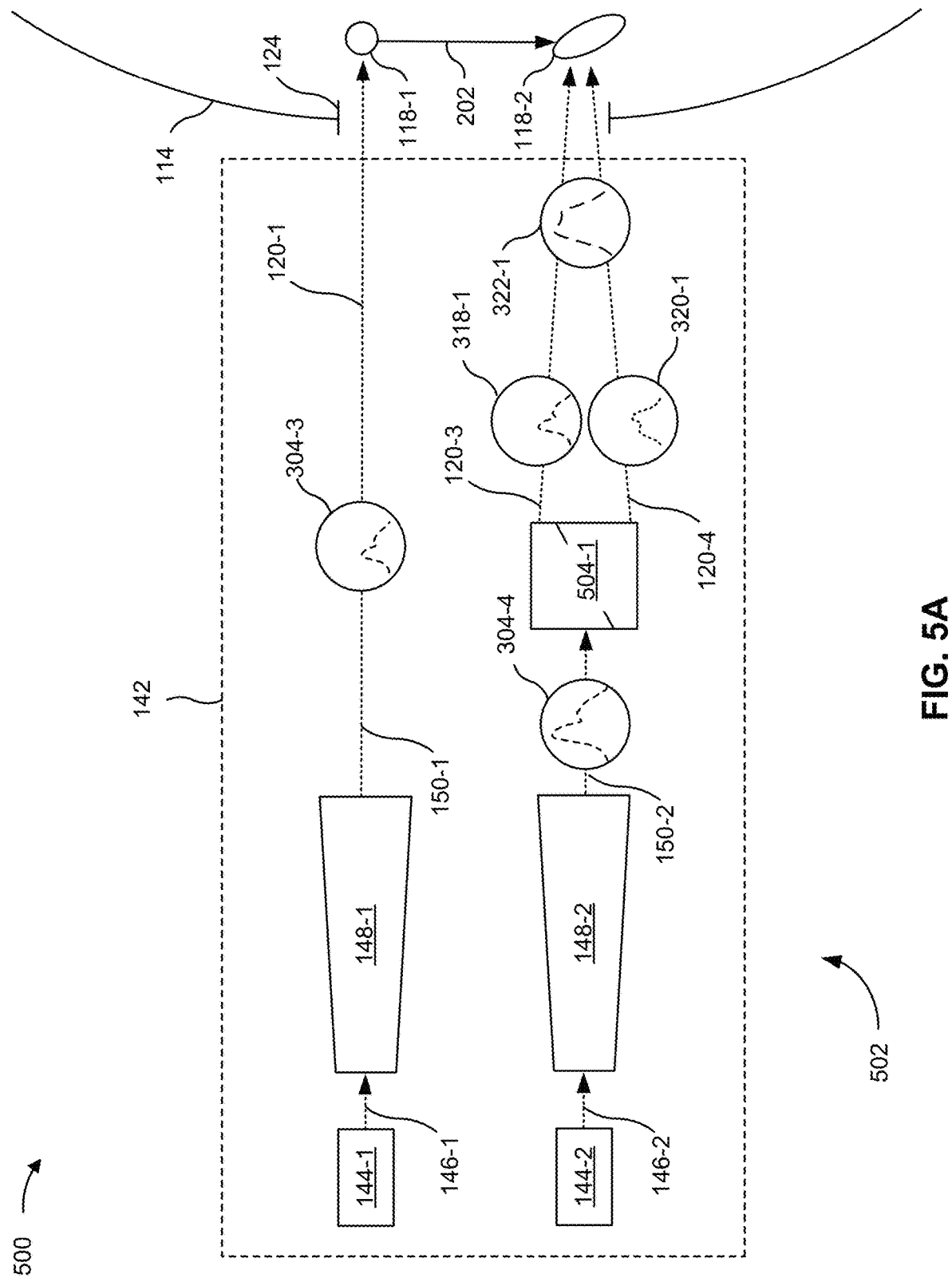
FIGS. 5A-5F and 6 are diagrams of example implementations described herein.

FIG. 5A shows an example implementation 502 in which the pre-pulse laser beam 120-1 provides energy to deform the droplet 118-1 at a first location along the path 202 within a vessel (e.g., the vessel 112). The example implementation 502 of FIG. 5A also shows a combination of a primary main-pulse laser beam 120-3 and an auxiliary main-pulse laser beam 120-4 providing energy to the deformed droplet 118-2 at a second location along the path 202 within the vessel to generate the plasma. Such a combination may increase beam profile uniformity to increase plasma heating efficiency. The pre-pulse laser beam 120-1, the primary main-pulse laser beam 120-3, and the auxiliary main-pulse laser beam 120-4 are focused and/or provided through the window 124 of the collector 114.

In FIG. 5A, the laser source 142 includes a pre-pulse seed laser 144-1 which provides a pre-pulse seed laser beam 146-1 to a pre-pulse amplifier chain 148-1. The pre-pulse amplifier chain 148-1 generates a pre-pulse laser output 150-1. The pre-pulse laser beam 120-1, which may correspond to the pre-pulse laser output 150-1, may have a pre-pulse spatial energy-distribution profile 304-3.

Also in FIG. 5A, the laser source 142 includes a main-pulse seed laser 144-2 which provides a main-pulse seed laser beam 146-2 to a main-pulse amplifier chain 148-2. The main-pulse amplifier chain 148-2 provides a main-pulse laser output 150-2 to a main-pulse optical component 504-1. The main-pulse laser output 150-2 may have a main-pulse spatial energy-distribution profile 304-4.

As shown in FIG. 5A, the main-pulse optical component 504-1 splits the main-pulse laser output 150-2 into a plurality of portions. The main-pulse optical component 504-1 includes a beam splitter, a multiple-layer mirror, a multiple-layer reflector, and/or another type of optical component that is configured to split the main-pulse laser output 150-2 into the plurality of portions. A first portion of the plurality of portions includes the primary main-pulse laser beam 120-3. A second portion of the plurality of portions includes the auxiliary main-pulse laser beam 120-4. In some implementations, the main-pulse optical component 504-1 rotates the second portion. The primary main-pulse laser beam 120-3 has a primary main-pulse spatial energy-distribution profile 318-1 and the auxiliary main-pulse laser beam 120-4 has an auxiliary main-pulse spatial energy-distribution profile 320-1. The auxiliary main-pulse spatial energy-distribution profile 320-1 may be approximately mirrored relative to the primary main-pulse spatial energy-distribution profile 318-1 as a result of the main-pulse laser output 150-2 being mirrored by the main-pulse optical component 504-1.

The primary main-pulse laser beam 120-3 and the auxiliary main-pulse laser beam 120-4 may be physically combined, which results in a combining of the primary main-pulse spatial energy-distribution profile 318-1 and the auxiliary main-pulse spatial energy-distribution profile 320-1 to generate a combined main-pulse spatial energy-distribution profile 322-1. The spatial uniformity of the spatial energy distribution of the combined main-pulse spatial energy-distribution profile 322-1 is increased (e.g., more Gaussian) relative to either the primary main-pulse spatial energy-distribution profile 318-1 or to the auxiliary main-pulse spatial energy-distribution profile 320-1.

Figure 5B:
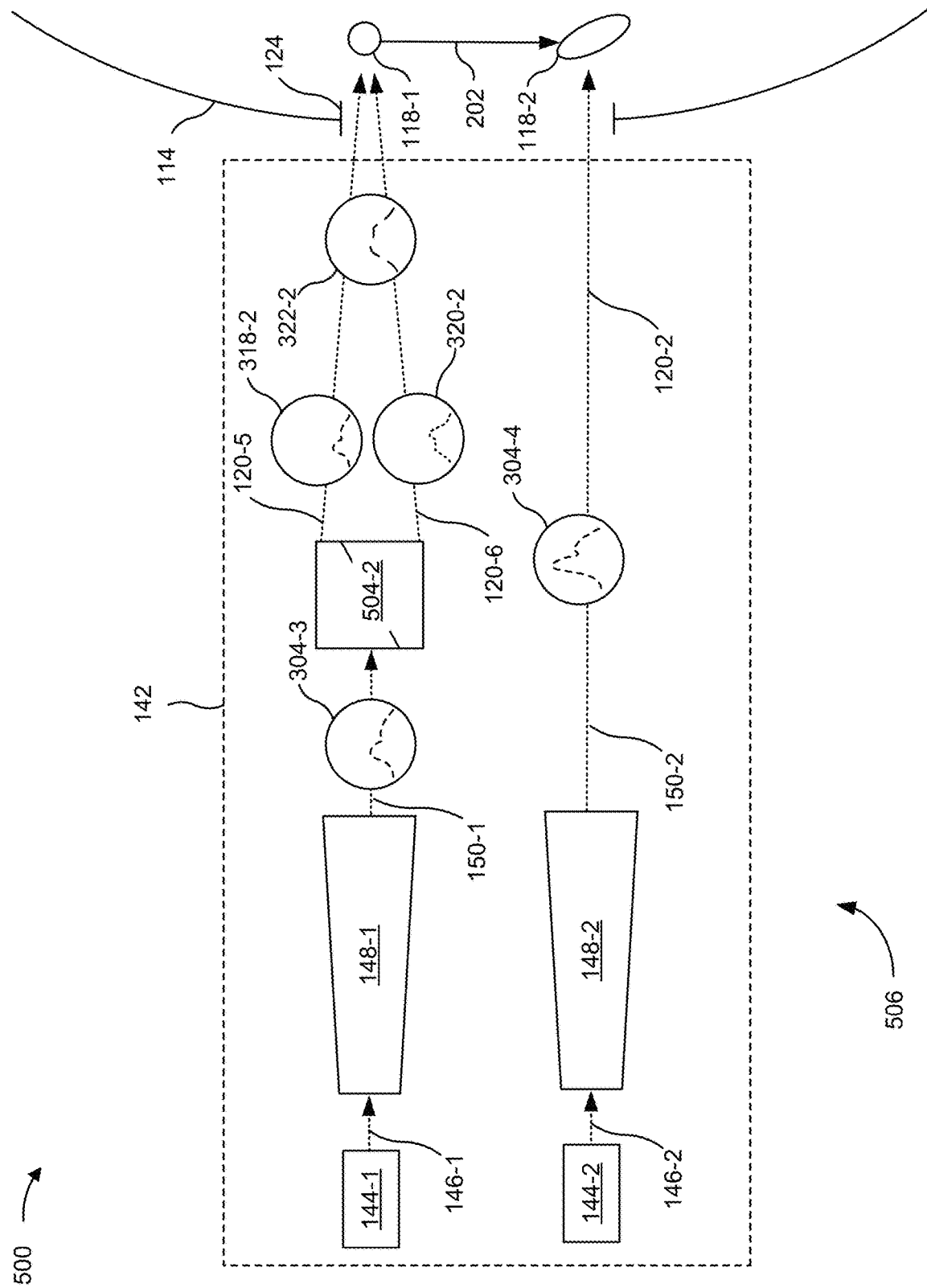

FIG. 5B shows an example implementation 506 in which a combination of a primary pre-pulse laser beam 120-5 and an auxiliary pre-pulse laser beam 120-6 provide energy to deform the droplet 118-1 at the first location along the path 202 within the vessel. Such a combination may increase a uniformity of a distribution of energy that shapes the deformed droplet 118-2.

The example implementation 506 of FIG. 5B also shows the main-pulse laser beam 120-2 providing energy to the deformed droplet 118-2 at the second location along the path 202 within the vessel to generate the plasma. The primary pre-pulse laser beam 120-5, the auxiliary pre-pulse laser beam 120-6, and the main-pulse laser beam 120-2 are focused and/or provided through the window 124 of the collector 114.

In FIG. 5B, the laser source 142 includes a pre-pulse seed laser 144-1 which provides a pre-pulse seed laser beam 146-1 to a pre-pulse amplifier chain 148-1. The pre-pulse amplifier chain 148-1 provides the pre-pulse laser output 150-1 having the pre-pulse spatial energy-distribution profile 304-3 to a pre-pulse optical component 504-2.

As shown in FIG. 5B, the pre-pulse optical component 504-2 splits the pre-pulse laser output 150-1 into a plurality of portions. The pre-pulse optical component 504-2 includes a beam splitter, a multiple-layer mirror, a multiple-layer reflector, and/or another type of optical component that is configured to split the pre-pulse laser output 150-1 into the plurality of portions. A first portion of the plurality of portions includes the primary pre-pulse laser beam 120-5. A second portion of the plurality of portions includes the auxiliary pre-pulse laser beam 120-6. In some implementations, the pre-pulse optical component 504-2 rotates the second portion. The primary pre-pulse laser beam 120-5 has a primary pre-pulse spatial energy-distribution profile 318-2 and the auxiliary pre-pulse laser beam 120-6 has an auxiliary pre-pulse spatial energy-distribution profile 320-2. The auxiliary pre-pulse spatial energy-distribution profile 320-2 may be approximately mirrored relative to the primary pre-pulse spatial energy-distribution profile 318-2 as a result of the pre-pulse laser output 150-1 being mirrored by the pre-pulse optical component 504-2.

The primary pre-pulse laser beam 120-5 and the auxiliary pre-pulse laser beam 120-6 may be physically combined, which results in a combining of the primary pre-pulse spatial energy-distribution profile 318-2 and the auxiliary pre-pulse spatial energy-distribution profile 320-2 to generate a combined pre-pulse spatial energy-distribution profile 322-2. The combined pre-pulse spatial energy-distribution profile 322-2 may have a spatial energy-distribution profile that is more normal (e.g., more Gaussian) in comparison to either the primary pre-pulse spatial energy-distribution profile 318-2 or to the auxiliary pre-pulse spatial energy-distribution profile 320-2.

Also in FIG. 5B, the laser source 142 includes the main-pulse seed laser 144-2 which provides the main-pulse seed laser beam 146-2 to the main-pulse amplifier chain 148-2. The main-pulse amplifier chain 148-2 generates the main-pulse laser output 150-2. The main-pulse laser beam 120-2, which may correspond to the main-pulse laser output 150-2, includes the main-pulse spatial energy-distribution profile 304-4.

Figure 5C:
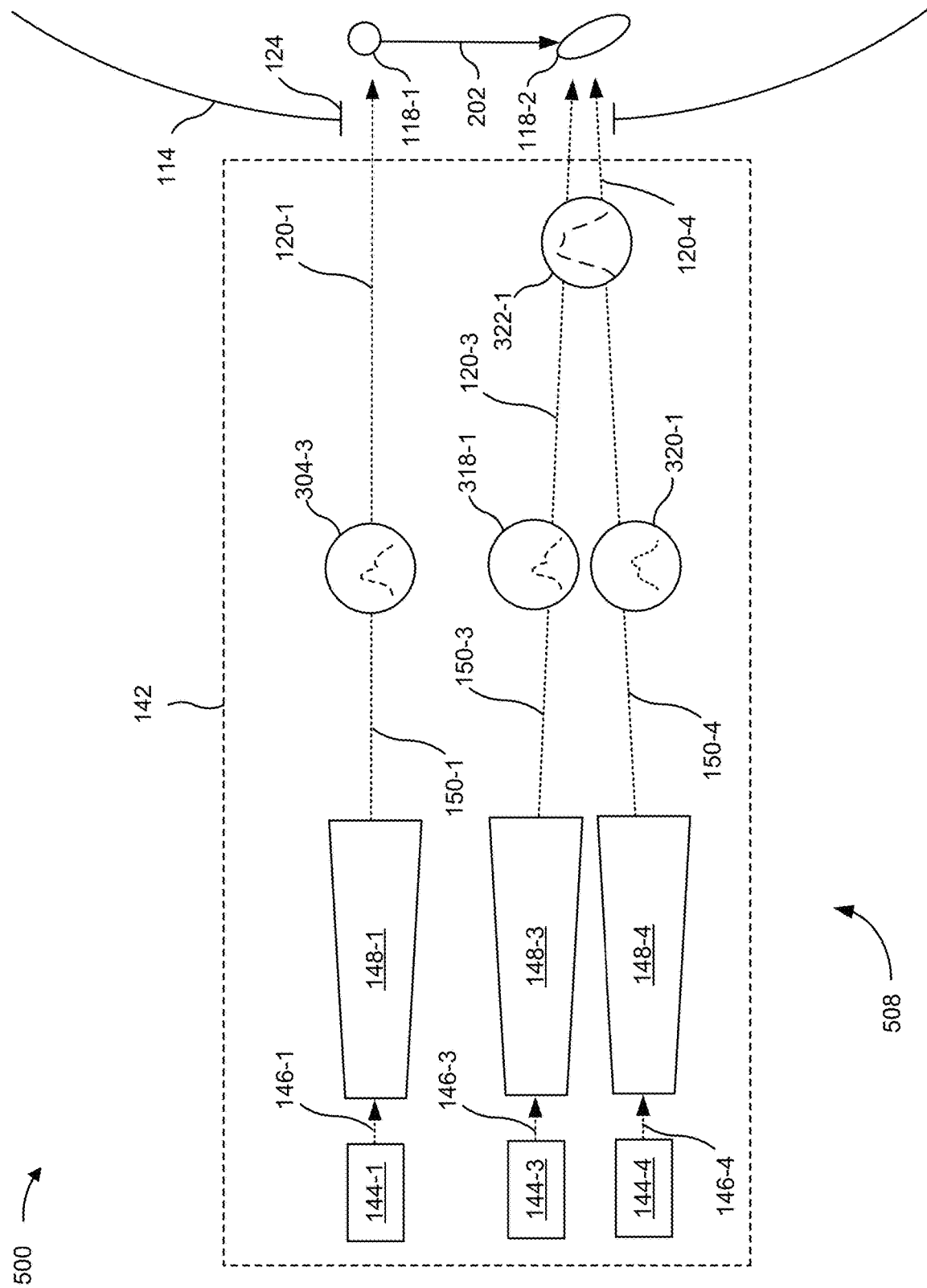

In the example implementation 508 of FIG. 5C, the pre-pulse laser beam 120-1 provides energy to the deform the droplet 118-1 at a first location along the path 202 within a vessel (e.g., the vessel 112). The example implementation 508 of FIG. 5C also shows a combination of the primary main-pulse laser beam 120-3 and the auxiliary main-pulse laser beam 120-4 providing energy to the deformed droplet 118-2 at a second location along the path 202 within the vessel to generate the plasma. Such a combination may increase beam profile uniformity to increase plasma heating efficiency. The pre-pulse laser beam 120-1, the primary main-pulse laser beam 120-3, and the auxiliary main-pulse laser beam 120-4 are focused and/or provided through the window 124 of the collector 114.

In FIG. 5C, the laser source 142 includes the pre-pulse seed laser 144-1 which provides the pre-pulse seed laser beam 146-1 to the pre-pulse amplifier chain 148-1. The pre-pulse amplifier chain 148-1 generates the pre-pulse laser output 150-1. In some implementations and as shown in FIG. 5C, the pre-pulse laser beam 120-1, corresponding to the pre-pulse laser output 150-1, includes the pre-pulse spatial energy-distribution profile 304-3.

Also in FIG. 5C, the laser source 142 includes a primary main-pulse seed laser 144-3 which provides a primary main-pulse seed laser beam 146-3 to a primary main-pulse amplifier chain 148-3. The primary main-pulse amplifier chain 148-3 generates a primary main-pulse laser output 150-3. In some implementations and as shown in FIG. 5C, the primary main-pulse laser beam 120-3, corresponding to the primary main-pulse laser output 150-3, includes the primary main-pulse spatial energy-distribution profile 318-1.

The laser source 142 of FIG. 5C further includes an auxiliary main-pulse seed laser 144-4 which provides an auxiliary main-pulse seed laser beam 146-4 to an auxiliary main-pulse amplifier chain 148-4. The auxiliary main-pulse amplifier chain 148-4 generates an auxiliary main-pulse laser output 150-4. In some implementations and as shown in FIG. 5C, the auxiliary main-pulse laser beam 120-4, corresponding to the auxiliary main-pulse laser output 150-4, includes the auxiliary main-pulse spatial energy-distribution profile 320-1. In some implementations, the auxiliary main-pulse spatial energy-distribution profile 320-1 is determined by a controller or another device, as described in connection with FIG. 7 and/or elsewhere herein.

The primary main-pulse laser beam 120-3 and the auxiliary main-pulse laser beam 120-4 may be physically combined, which results in a combining of the primary main-pulse spatial energy-distribution profile 318-1 and the auxiliary main-pulse spatial energy-distribution profile 320-1 to generate the combined main-pulse spatial energy-distribution profile 322-1. The combined main-pulse spatial energy-distribution profile 322-1 may have a spatial energy-distribution profile that is more normal (e.g., more Gaussian) in comparison to either the primary main-pulse spatial energy-distribution profile 318-1 or to the auxiliary main-pulse spatial energy-distribution profile 320-1.

In some implementations, selecting the auxiliary main-pulse seed laser 144-4 and/or the auxiliary main-pulse laser amplifier chain 148-4 is based on characteristics of the primary main-pulse laser output 150-3. For example, based on the primary main-pulse spatial energy-distribution profile 318-1 of the primary main-pulse laser output 150-3, one or more of the auxiliary main-pulse seed laser 144-4 and/or the auxiliary main-pulse laser amplifier chain 148-4 may be selected such that the auxiliary main-pulse spatial energy-distribution profile 320-1 of the auxiliary main-pulse laser beam 120-4 complements the primary main-pulse spatial energy-distribution profile 318-1 of the primary main-pulse laser beam 120-3 to improve a distribution (e.g., uniformity) of the combined main-pulse spatial energy-distribution profile 322-1.

Figure 5D:
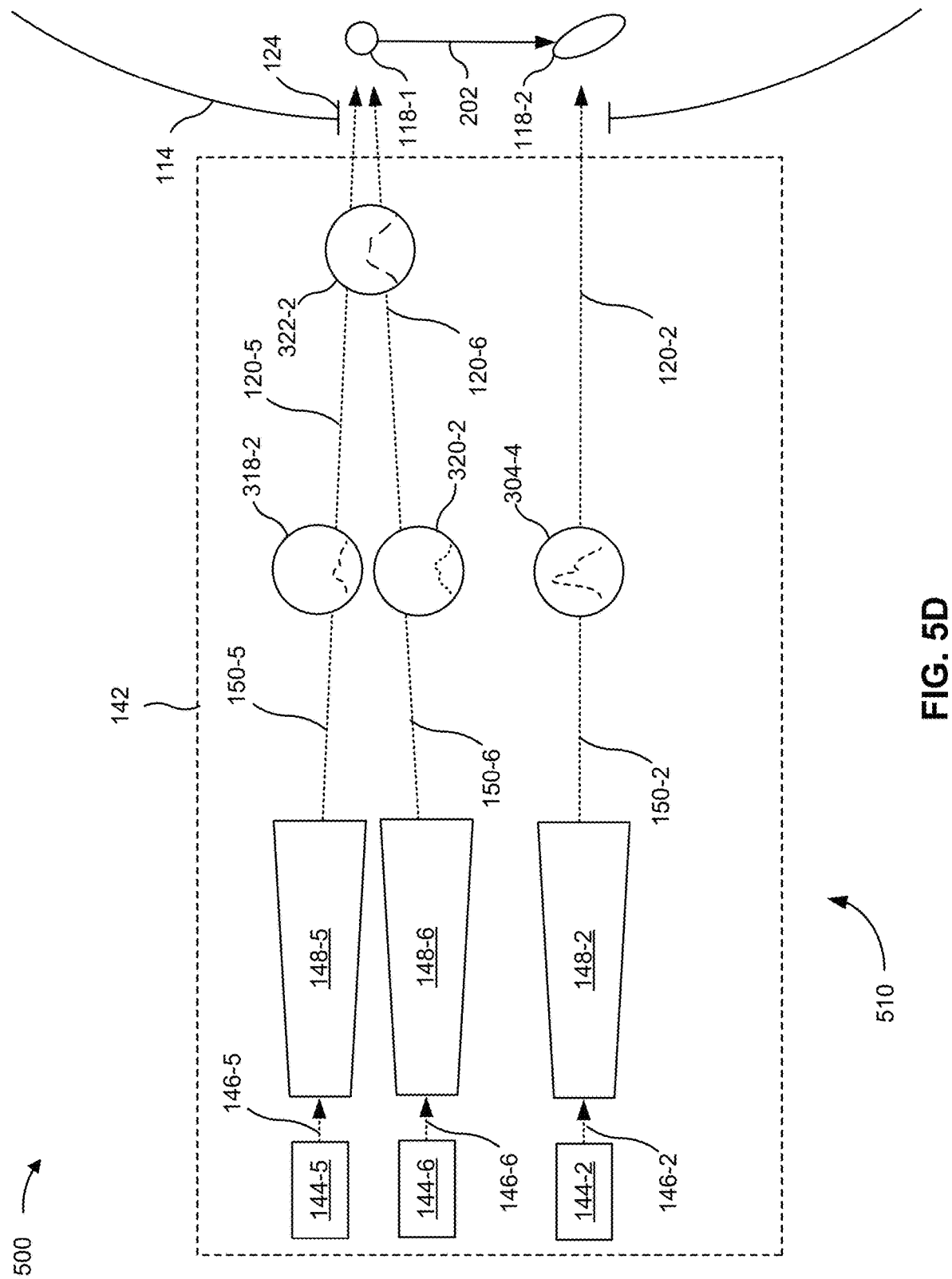

FIG. 5D shows an example implementation 510 in which a combination of a primary pre-pulse laser beam 120-5 and an auxiliary pre-pulse laser beam 120-6 provide energy to deform the droplet 118-1 at the first location along the path 202 within a vessel (e.g., the vessel 112). Such a combination may increase a uniformity of a distribution of energy that shapes the deformed droplet 118-2. The example implementation 510 of FIG. 5D also shows main-pulse laser beam 120-2 providing energy to the deformed droplet 118-2 at the second location along the path 202 within the vessel to generate the plasma. The primary pre-pulse laser beam 120-5, the auxiliary pre-pulse laser beam 120-6, and the main-pulse laser beam 120-2 are focused and/or provided through the window 124 of the collector 114.

In FIG. 5D, the laser source 142 includes a primary pre-pulse seed laser 144-5 which provides a primary pre-pulse seed laser beam 146-5 to a primary pre-pulse amplifier chain 148-5. The primary pre-pulse amplifier chain 148-5 generates a primary pre-pulse laser output 150-5. In some implementations and as shown in FIG. 5D, the primary pre-pulse laser beam 120-5, corresponding to the primary pre-pulse laser output 150-5, includes the primary pre-pulse spatial energy-distribution profile 318-2.

The laser source 142 of FIG. 5D further includes an auxiliary pre-pulse seed laser 144-6 which provides an auxiliary pre-pulse seed laser beam 146-6 to an auxiliary pre-pulse amplifier chain 148-6. The auxiliary pre-pulse amplifier chain 148-6 generates an auxiliary pre-pulse laser output 150-6. In some implementations and as shown in FIG. 5D, the auxiliary pre-pulse laser beam 120-6, corresponding to the auxiliary pre-pulse laser output 150-6, includes the auxiliary pre-pulse spatial energy-distribution profile 320-2. In some implementations, the auxiliary pre-pulse spatial energy-distribution profile 320-2 is determined by a controller or another device, as described in connection with FIG. 7 and/or elsewhere herein.

The primary pre-pulse laser beam 120-5 and the auxiliary pre-pulse laser beam 120-6 may be physically combined, which results in a combining of the primary pre-pulse spatial energy-distribution profile 318-2 and the auxiliary pre-pulse spatial energy-distribution profile 320-2 to generate the combined pre-pulse spatial energy-distribution profile 322-2. The combined pre-pulse spatial energy-distribution profile 322-2 may have a spatial energy-distribution profile that is more normal (e.g., more Gaussian) in comparison to either the primary pre-pulse spatial energy-distribution profile 318-2 or to the auxiliary pre-pulse spatial energy-distribution profile 320-2.

In some implementations, selecting the auxiliary pre-pulse seed laser 144-6 and/or the auxiliary pre-pulse laser amplifier chain 148-6 is based on characteristics of the primary pre-pulse laser output 150-5. For example, based on the primary pre-pulse spatial energy-distribution profile 318-2 of the primary pre-pulse laser output 150-5, one or more of the auxiliary pre-pulse seed laser 144-6 and/or the auxiliary pre-pulse laser amplifier chain 148-6 may be selected such that the auxiliary pre-pulse spatial energy-distribution profile 320-2 of the auxiliary pre-pulse laser beam 120-6 complements the primary pre-pulse spatial energy-distribution profile 318-2 of the primary pre-pulse laser beam 120-5 to improve a distribution of the combined pre-pulse spatial energy-distribution profile 322-2.

Figure 5E:
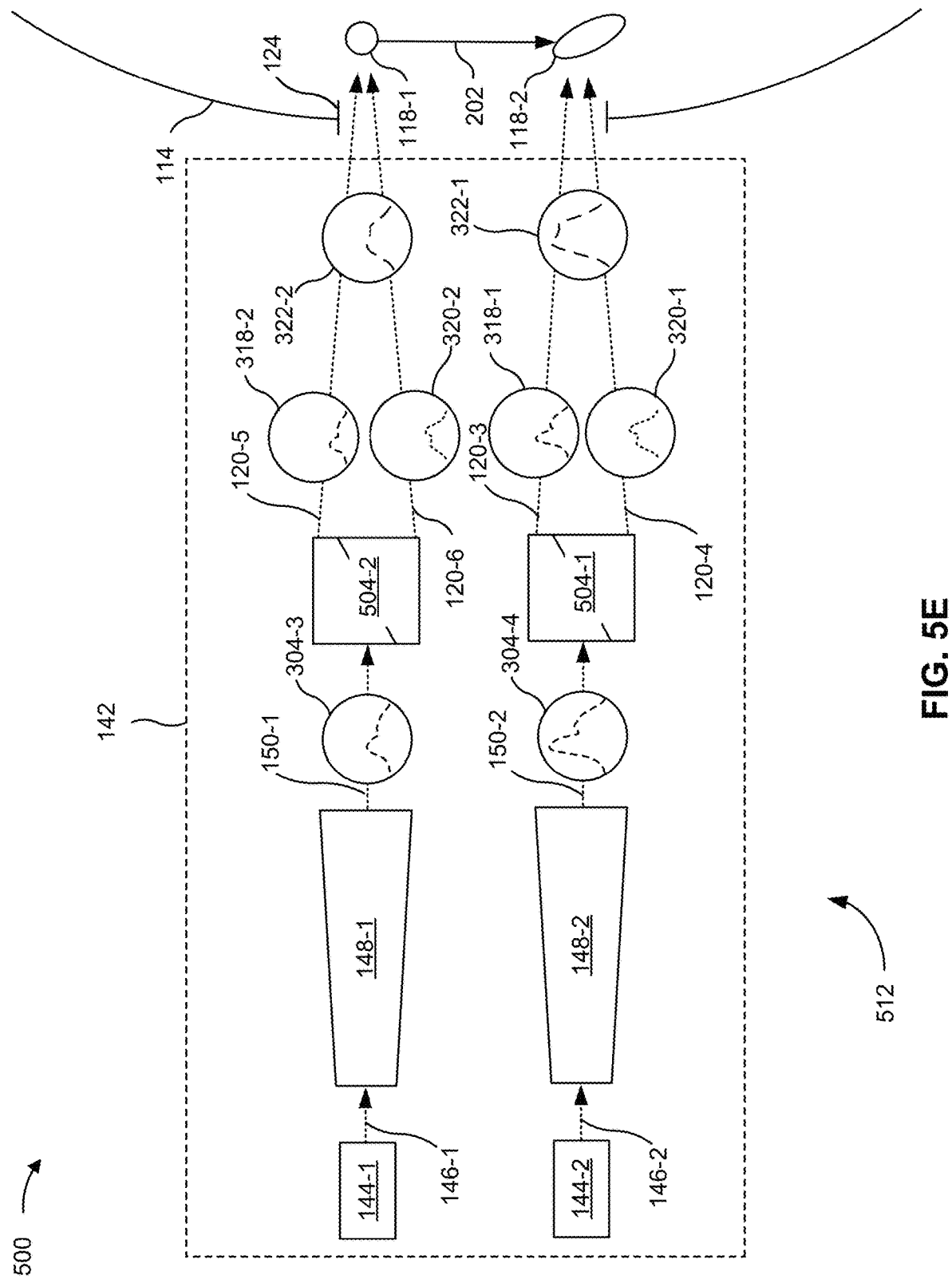

FIG. 5E shows an example implementation 512 in which a combination of the primary pre-pulse laser beam 120-5 and the auxiliary pre-pulse laser beam 120-6 provides energy to deform the droplet 118-1 at a first location along the path 202 within a vessel (e.g., the vessel 112). Such a combination may increase a uniformity of a distribution of energy that shapes the deformed droplet 118-2.

The example implementation 512 of FIG. 5E also shows a combination of the primary main-pulse laser beam 120-3 and the auxiliary main-pulse laser beam 120-4 providing energy to the deformed droplet 118-2 at a second location along the path 202 within the vessel to generate the plasma. Such a combination may increase beam profile uniformity to increase plasma heating efficiency. The primary pre-pulse laser beam 120-5, the auxiliary pre-pulse laser beam 120-6, the primary main-pulse laser beam 120-3, and the auxiliary main-pulse laser beam 120-4 are focused and/or provided through the window 124 of the collector 114.

In FIG. 5E, the laser source 142 includes the pre-pulse seed laser 144-1 which provides the pre-pulse seed laser beam 146-1 to the pre-pulse amplifier chain 148-1. The pre-pulse amplifier chain 148-1 provides the pre-pulse laser output 150-1 having the pre-pulse spatial energy-distribution profile 304-3 to the pre-pulse optical component 504-2.

As shown in FIG. 5E, the pre-pulse optical component 504-2 splits the pre-pulse laser output 150-1 into a plurality of portions. The pre-pulse optical component 504-2 may include a beam splitter, a multiple-layer mirror, a multiple-layer reflector, and/or another type of optical component that is configured to split the pre-pulse laser output 150-1 into the plurality of portions. A first portion of the plurality of portions includes the primary pre-pulse laser beam 120-5. A second portion of the plurality of portions includes the auxiliary pre-pulse laser beam 120-6. In some implementations, the pre-pulse optical component 504-2 rotates the second portion. The primary pre-pulse laser beam 120-5 has a primary pre-pulse spatial energy-distribution profile 318-2 and the auxiliary pre-pulse laser beam 120-6 has an auxiliary pre-pulse spatial energy-distribution profile 320-2. The auxiliary pre-pulse spatial energy-distribution profile 320-2 may be approximately mirrored relative to the primary pre-pulse spatial energy-distribution profile 318-2 as a result of the pre-pulse laser output 150-1 being mirrored by the pre-pulse optical component 504-2.

The primary pre-pulse laser beam 120-5 and the auxiliary pre-pulse laser beam 120-6 may be physically combined, which results in a combining of the primary pre-pulse spatial energy-distribution profile 318-2 and the auxiliary pre-pulse spatial energy-distribution profile 320-2 to generate the combined pre-pulse spatial energy-distribution profile 322-2. The combined pre-pulse spatial energy-distribution profile 322-2 may have a spatial energy-distribution profile that is more normal (e.g., more Gaussian) in comparison to either the primary pre-pulse spatial energy-distribution profile 318-2 or to the auxiliary pre-pulse spatial energy-distribution profile 320-2.

Also in FIG. 5E, the laser source 142 includes the main-pulse seed laser 144-2 which provides the main-pulse seed laser beam 146-2 to the main-pulse amplifier chain 148-2. The main-pulse amplifier chain 148-2 provides the main-pulse laser output 150-2 to the main-pulse optical component 504-1. The main-pulse laser output 150-2 may have the main-pulse spatial energy-distribution profile 304-4.

As shown in FIG. 5E, the main-pulse optical component 504-1 splits the main-pulse laser output 150-2 into a plurality of portions. The main-pulse optical component 504-1 includes a beam splitter, a multiple-layer mirror, a multiple-layer reflector, and/or another type of optical component that is configured to split the main-pulse laser output 150-2 into the plurality of portions. A first portion of the plurality of portions includes the primary main-pulse laser beam 120-3. A second portion of the plurality of portions includes the auxiliary main-pulse laser beam 120-4. In some implementations, the main-pulse optical component 504-1 rotates the second portion. The primary main-pulse laser beam 120-3 has the primary main-pulse spatial energy-distribution profile 318-1 and the auxiliary main-pulse laser beam 120-4 has the auxiliary main-pulse spatial energy-distribution profile 320-1. The auxiliary main-pulse spatial energy-distribution profile 320-1 may be approximately mirrored relative to the primary main-pulse spatial energy-distribution profile 318-1 as a result of the main-pulse laser output 150-2 being mirrored by the main-pulse optical component 504-1.

The primary main-pulse laser beam 120-3 and the auxiliary main-pulse laser beam 120-4 may be physically combined, which results in a combining of the primary main-pulse spatial energy-distribution profile 318-1 and the auxiliary main-pulse spatial energy-distribution profile 320-1 to generate the combined main-pulse spatial energy-distribution profile 322-1. The combined main-pulse spatial energy-distribution profile 322-1 may have a spatial energy-distribution profile that is more normal (e.g., more Gaussian) in comparison to either the primary main-pulse spatial energy-distribution profile 318-1 or to the auxiliary main-pulse spatial energy-distribution profile 320-1.

This increases in uniformity of the deformation of the shaped droplet 118-2 due the combined pre-pulse spatial energy-distribution profile 322-2. This increases in plasma generation due to the combined main-pulse spatial energy-distribution profile 322-1, and increases the conversion efficiency and the intensity of EUV radiation from the laser source 142 relative to implementations described in connection with FIGS. 5A-5D, among other examples.

Figure 5F:
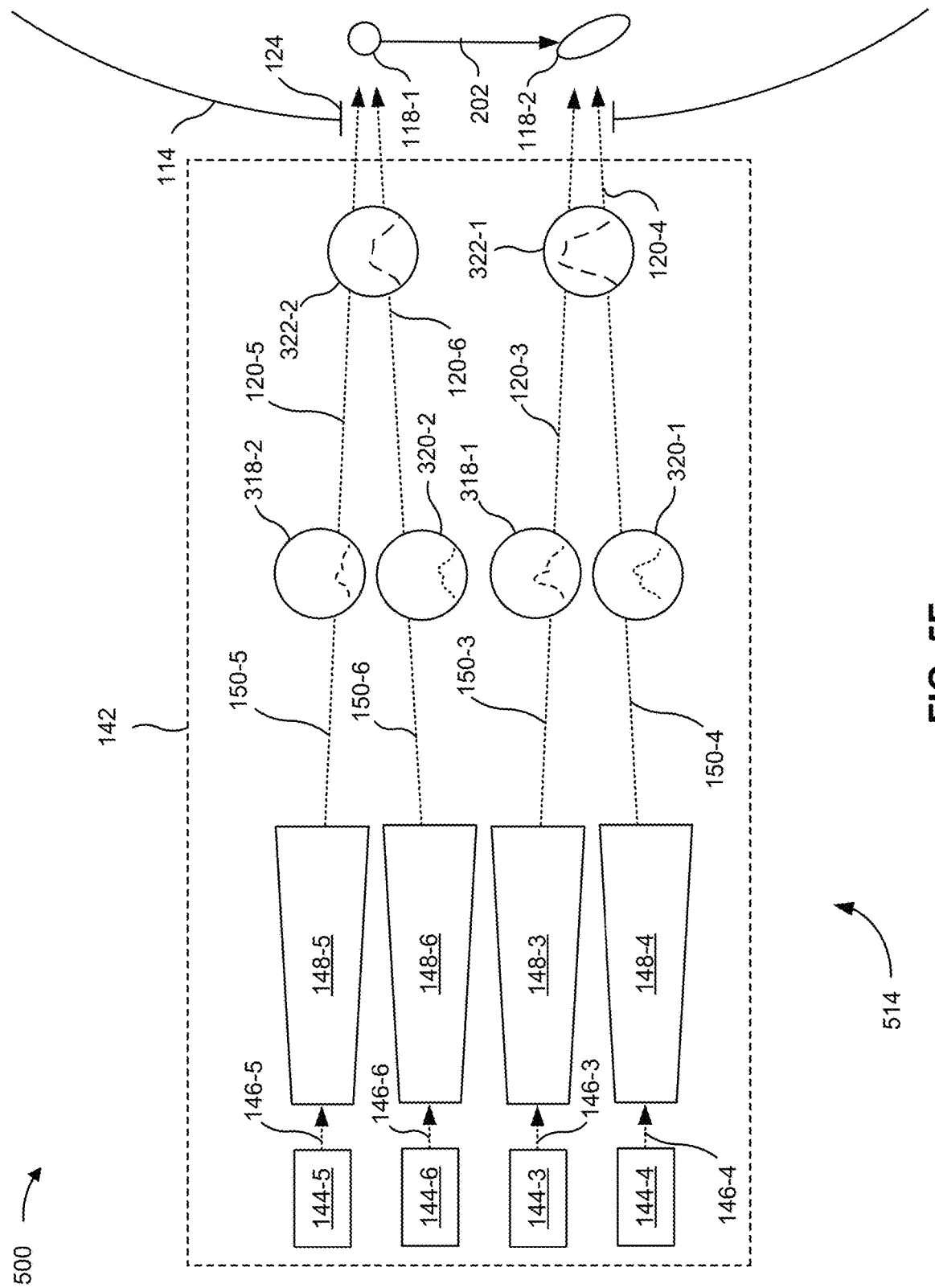

FIG. 5F shows an example implementation 514 in which a combination of the primary pre-pulse laser beam 120-5 and the auxiliary pre-pulse laser beam 120-6 provides energy to deform the droplet 118-1 at a first location along the path 202 within a vessel (e.g., the vessel 112). Such a combination may increase a uniformity of a distribution of energy that shapes the deformed droplet 118-2.

The example implementation 514 of FIG. 5F also shows a combination of the primary main-pulse laser beam 120-3 and the auxiliary main-pulse laser beam 120-4 providing energy to the deformed droplet 118-2 at a second location along the path 202 within the vessel to generate the plasma. Such a combination may increase beam profile uniformity to increase plasma heating efficiency. The primary pre-pulse laser beam 120-5, the auxiliary pre-pulse laser beam 120-6, the primary main-pulse laser beam 120-3, and the auxiliary main-pulse laser beam 120-4 are focused and/or provided through the window 124 of the collector 114.

In FIG. 5F, the laser source 142 includes the primary pre-pulse seed laser 144-5 which provides the primary pre-pulse seed laser beam 146-5 to the primary pre-pulse amplifier chain 148-5. The primary pre-pulse amplifier chain 148-5 generates a primary pre-pulse laser output 150-5. In some implementations and as shown in FIG. 5F, the primary pre-pulse laser beam 120-5, corresponding to the primary pre-pulse laser output 150-5, includes the primary pre-pulse spatial energy-distribution profile 318-2.

Also in FIG. 5F, the laser source 142 includes the auxiliary pre-pulse seed laser 144-6 which provides the auxiliary pre-pulse seed laser beam 146-6 to the auxiliary pre-pulse amplifier chain 148-6. The auxiliary pre-pulse amplifier chain 148-6 generates the auxiliary pre-pulse laser output 150-6. In some implementations and as shown in FIG. 5F, the auxiliary pre-pulse laser beam 120-6, corresponding to the auxiliary pre-pulse laser output 150-6, includes the auxiliary pre-pulse spatial energy-distribution profile 320-2.

The primary pre-pulse laser beam 120-5 and the auxiliary pre-pulse laser beam 120-6 may be physically combined, which results in a combining of the primary pre-pulse spatial energy-distribution profile 318-2 and the auxiliary pre-pulse spatial energy-distribution profile 320-2 to generate the combined pre-pulse spatial energy-distribution profile 322-2. The combined pre-pulse spatial energy-distribution profile 322-2 may have a spatial energy-distribution profile that is more normal (e.g., more Gaussian) in comparison to either the primary pre-pulse spatial energy-distribution profile 318-2 or to the auxiliary pre-pulse spatial energy-distribution profile 320-2.

In some implementations, a selection of the auxiliary pre-pulse seed laser 144-6 and/or the auxiliary pre-pulse laser amplifier chain 148-6 is based on characteristics of the primary pre-pulse laser output 150-5. For example, based on the primary pre-pulse spatial energy-distribution profile 318-2 of the primary pre-pulse laser output 150-5, one or more of the auxiliary pre-pulse seed laser 144-6 and/or the auxiliary pre-pulse laser amplifier chain 148-6 may be selected such that the auxiliary pre-pulse spatial energy-distribution profile 320-2 of the auxiliary pre-pulse laser beam 120-6 complements the primary pre-pulse spatial energy-distribution profile 318-2 of the primary pre-pulse laser beam 120-5 to improve (e.g., increase a uniformity of) a distribution of the combined pre-pulse spatial energy-distribution profile 322-2.

The laser source 142 of FIG. 5F further includes the primary main-pulse seed laser 144-3 which provides the primary main-pulse seed laser beam 146-3 to the primary main-pulse amplifier chain 148-3. The primary main-pulse amplifier chain 148-3 generates the primary main-pulse laser output 150-3. In some implementations and as shown in FIG. 5F, the primary main-pulse laser beam 120-3, corresponding to the primary main-pulse laser output 150-3, includes the primary main-pulse spatial energy-distribution profile 318-1.

The laser source 142 of FIG. 5F further includes the auxiliary main-pulse seed laser 144-4 which provides the auxiliary main-pulse seed laser beam 146-4 to the auxiliary main-pulse amplifier chain 148-4. The auxiliary main-pulse amplifier chain 148-4 generates the auxiliary main-pulse laser output 150-4. In some implementations and as shown in FIG. 5F, the auxiliary main-pulse laser beam 120-4, corresponding to the auxiliary main-pulse laser output 150-4, includes the auxiliary main-pulse spatial energy-distribution profile 320-1.

The primary main-pulse laser beam 120-3 and the auxiliary main-pulse laser beam 120-4 may be physically combined, which results in a combining of the primary main-pulse spatial energy-distribution profile 318-1 and the auxiliary main-pulse spatial energy-distribution profile 320-1 to generate the combined main-pulse spatial energy-distribution profile 322-1. The combined main-pulse spatial energy-distribution profile 322-1 may have a spatial energy-distribution profile that is more normal (e.g., more Gaussian) in comparison to either the primary main-pulse spatial energy-distribution profile 318-1 or to the auxiliary main-pulse spatial energy-distribution profile 320-1.

In some implementations, a selection of the auxiliary main-pulse seed laser 144-4 and/or the auxiliary main-pulse laser amplifier chain 148-4 is based on characteristics of the primary main-pulse laser output 150-3. For example, based on the primary main-pulse spatial energy-distribution profile 318-1 of the primary main-pulse laser output 150-3, one or more of the auxiliary main-pulse seed laser 144-4 and/or the auxiliary main-pulse laser amplifier chain 148-4 may be selected such that the auxiliary main-pulse spatial energy-distribution profile 320-1 of the auxiliary main-pulse laser beam 120-4 complements the primary main-pulse spatial energy-distribution profile 318-1 of the primary main-pulse laser beam 120-3 to improve (e.g., increase uniformity of) a distribution of the combined main-pulse spatial energy-distribution profile 322-1.

The use of the four seed lasers 144-3 through 144-6, in combination with the four amplifier chains 148-3 through 148-6, may allow for tuning of the spatial energy-distribution profiles for each of the laser beams 120-3 through 120-6. As an example, tuning may include adjusting a pulse duration of a primary or an auxiliary laser beam or adjusting an intensity of a primary or an auxiliary laser beam to generate a targeted spatial energy-distribution profile. Such tuning, in combination with increases in uniformity to the shaped droplet 118-2 due the combined pre-pulse spatial energy-distribution profile 322-2 and increases in plasma generation due to the combined main-pulse spatial energy-distribution profile 322-1, may improve the conversion efficiency and the intensity of EUV radiation from the laser source 142 relative to implementations described in connection with FIGS. 5A-5E.

As indicated above, FIGS. 5A-5F are provided as examples. Other examples may differ from what is described with regard to FIGS. 5A-5F. For example, another example may include additional components, fewer components, different components, or differently arranged components than those shown in FIGS. 5A-5F. This includes different quantities of laser sources (e.g., seed lasers and amplifier chains) to generate multiple auxiliary laser beams (e.g., two or more auxiliary pre-pulse laser beam or two or more auxiliary main-pulse laser beams, among other examples) and multiple types of auxiliary laser beams (e.g., multiple types of auxiliary laser beams that include continuous waves or pulse waves, among other examples). Additionally, or alternatively, a set of components (e.g., one or more components) of FIGS. 5A-5F may perform one or more functions described herein as being performed by another set of components.

Figure 6:
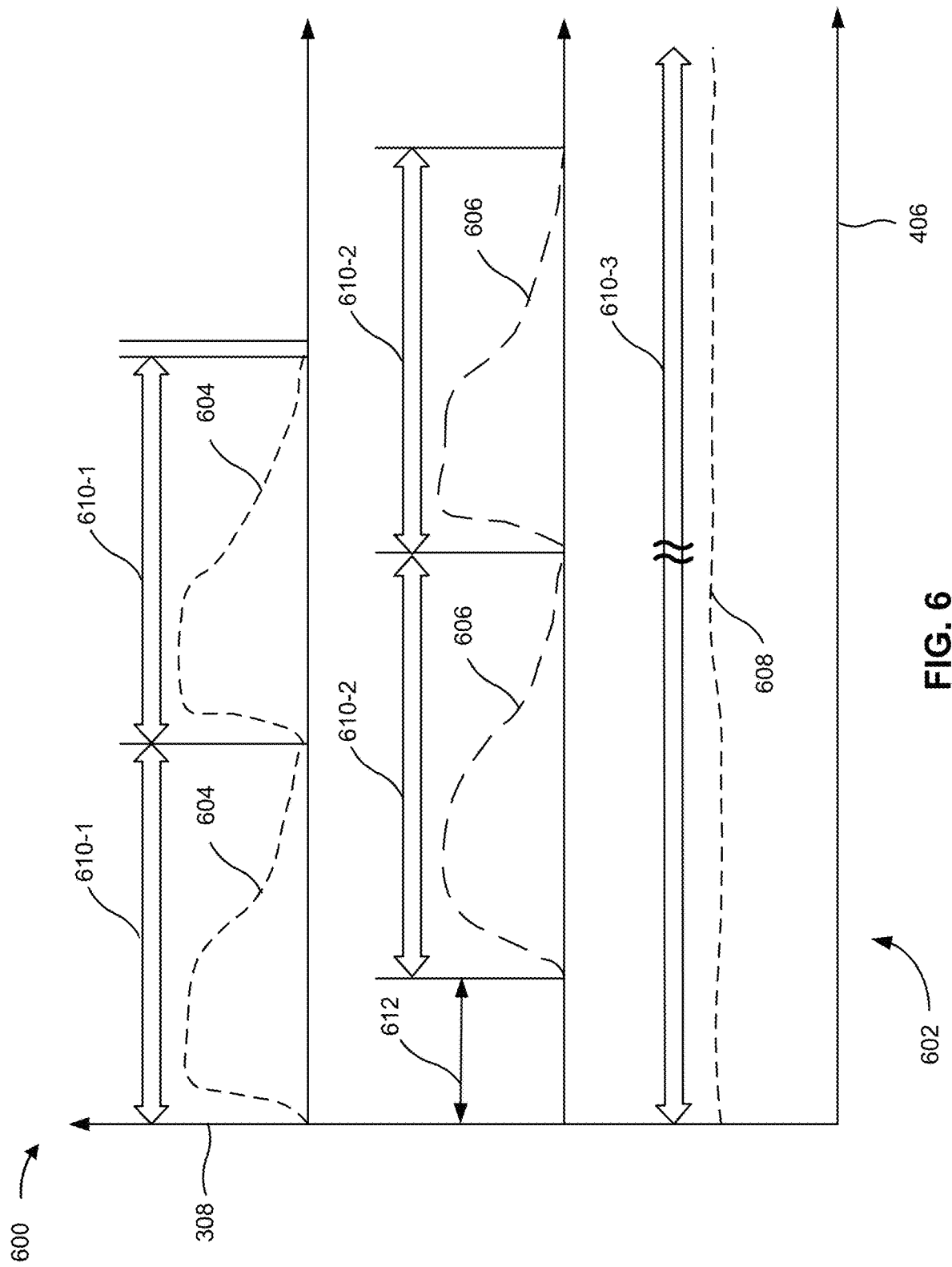

FIG. 6 is a diagram of an example implementation 600 described herein. Example 602 of FIG. 6 shows a primary laser temporal energy-intensity profile 604 of a primary laser source (e.g., a temporal energy-intensity profile of the primary main-pulse seed laser 144-3 or the primary pre-pulse seed laser 144-5, among other examples), an auxiliary laser temporal energy-intensity profile 606 of an auxiliary laser source (e.g., a temporal energy-intensity profile of the auxiliary main-pulse seed laser 144-4 or the auxiliary pre-pulse seed laser 144-6, among other examples), and a combined laser temporal energy-intensity profile 608. The primary laser source and the auxiliary laser source may be included in a laser source of an EUV radiation source (e.g., the laser source 142 of the radiation source 102).

As shown in FIG. 6 and with regard to the primary laser temporal energy-intensity profile 604, an intensity of the primary laser source degrades (e.g., sometimes referred to as a thermal effect) during a primary laser source cold-to-hot period 610-1 (e.g., a period during which a temperature of the primary laser source increases). Also as shown in FIG. 6 and with regard to the auxiliary laser temporal energy-intensity profile 606, an intensity of the auxiliary laser source degrades during an auxiliary laser source cold-to-hot period 610-2.

To satisfy an intensity threshold (e.g., maintain an intensity at or above a minimum target intensity) for the laser source, and as shown in FIG. 6, activation/deactivation of the primary laser source and activation/deactivation of the auxiliary laser source may alternate. In such implementations, combining the primary laser temporal energy-intensity profile 604 and the auxiliary laser temporal energy-intensity profile 606 results in the combined laser temporal energy-intensity profile 608 satisfying the intensity threshold. Furthermore, a lengthier combined cold-to-hot period 610-3 may be realized.

In some implementations, alternating the activation/deactivation of the primary laser source with the activation/deactivation of the auxiliary laser source may be based on a timing offset 612. In some implementations, the timing offset 612 is predetermined and static (e.g., the timing offset 612 is determined based on the primary laser temporal energy-intensity profile 604 and the auxiliary laser temporal energy-intensity profile 606). In some implementations, the timing offset 612 is determined in real-time and dynamic (e.g., the timing offset 612 is determined based on detected intensities of the primary laser source and/or the auxiliary laser source during operation of the EUV radiation source, among other examples).

As indicated above, FIG. 6 is provided as an example. Other examples may differ from what is described with regard to FIG. 6.

Figure 7:
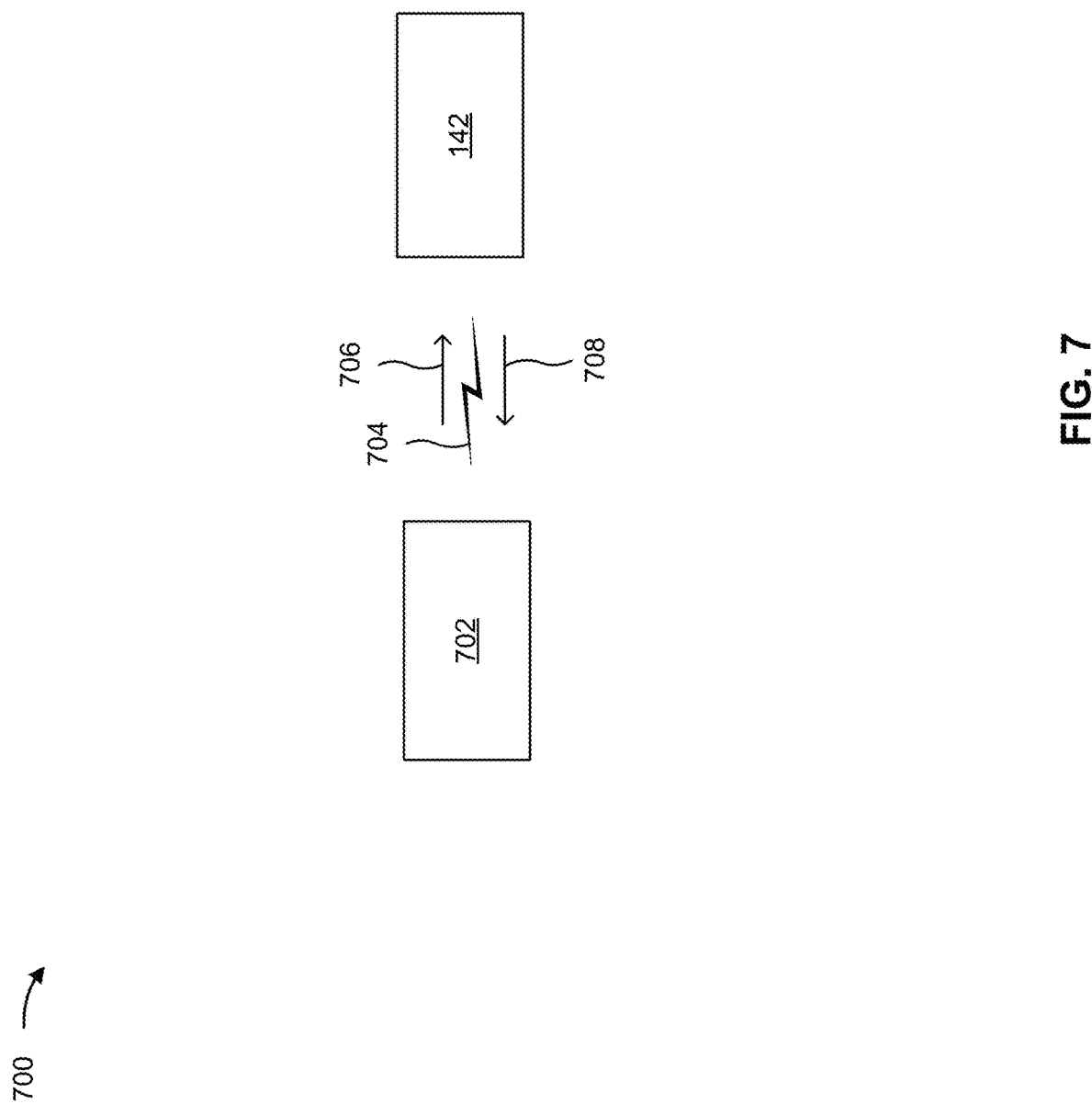
FIG. 7 is a diagram of an example implementation of a controller in communication with components of a laser source described herein.

FIG. 7 is a diagram of an example implementation 700 of a controller in communication with components of the laser source 142 (e.g., the pre-pulse seed laser 144-1, the primary main-pulse seed laser 144-3, and the auxiliary main-pulse seed laser 144-4, among other examples) described herein. As shown in FIG. 7, a controller 702 (e.g., a processor, a combination of a processor and memory, among other examples) is communicatively connected to the laser source 142 using one or more communication links 704 (e.g., one or more wireless-communication links, one or more wired-communication links, or a combination of one or more wireless-communication links and one or more wired-communication links). In some implementations, the controller 702 transmits one or more signals 706 to components of the laser source 142. In some implementations, the controller 702 receives one or more signals 708 from the components of the laser source 142.

As an example implementation, the controller 702 of FIG. 7 may provide, to a primary laser source associated with an EUV radiation source (e.g., the primary main-pulse seed laser 144-3 associated with the radiation source 102, among other examples), a first signal (e.g., a first signal transmitted using the one or more communication links 704, among other examples) to cause the primary laser source to generate a first plurality of laser beams (e.g., a first plurality of laser beams including multiples of the primary main-pulse laser beam 120-3). The first plurality of laser beams are to be used to generate, from a first plurality of droplets of a target material (e.g., a first plurality of the deformed droplets 118-2), a plasma (e.g., the plasma 204) within a vessel of an EUV radiation source (e.g., the vessel 112 of the radiation source 102).

The example implementation further includes providing, by the controller 702 and to the primary laser source, a second signal (e.g., a second signal transmitted using the one or more communication links 704, among other examples) to deactivate the primary laser source after the first plurality of laser beams are generated.

Continuing, the example implementation may include providing, by the controller 702 and to an auxiliary laser source associated with the EUV radiation source (e.g., the auxiliary main-pulse seed laser 144-4 associated with the radiation source 102, among other examples) a third signal to cause the auxiliary laser source to generate a second plurality of laser beams (e.g., a third signal transmitted using the one or more communication links 704, among other examples) to generate the plasma from a second plurality of droplets of the target material. The third signal is to cause the auxiliary laser source to generate the second plurality of laser beams at least one of concurrently with the primary laser source generating a subset of the first plurality of laser beams, or after the primary laser source finishes generating the first plurality of laser beams.

In the example implementation, providing the second signal to deactivate the primary laser source may be based on the controller 702 detecting a degradation of a power intensity of the primary laser source. For example, the controller 702 may receive a signal (e.g., receive a signal from a sensor within the vessel 112 of the radiation source 102) indicating a power intensity of the primary laser source and determine that the power intensity does not satisfy a threshold. As another example, the controller 702 may implement a machine-learning algorithm to determine, based on a temporal energy-intensity profile that characterizes cold-to-hot effects upon the primary laser source, a downward trend in the power intensity and determine to switch to the auxiliary laser source.

In some implementations, the controller 702 communicates with the laser source 142 to adjust one or more operating parameters (e.g., a timing parameter or a power input parameter, among other examples) of components of the laser source 142 (e.g., adjust one or more operating parameters of the pre-pulse seed laser 144-1, the main-pulse seed laser 144-2, the primary main-pulse seed laser 144-3, the primary pre-pulse seed laser 144-5, the auxiliary main-pulse seed laser 144-4, or the auxiliary pre-pulse seed laser 144-6, among other examples) using a machine-learning model. The machine-learning model may include and/or may be associated with one or more of a neural network model, a random forest model, a clustering model, or a regression model, among other examples.

In some implementations, the controller 702 uses the machine-learning model to activate, deactivate, or combine operation of the one or more components of the laser source 142 by providing candidate spatial energy-distribution profiles and temporal energy-intensity profiles as inputs to the machine-learning model, and using the machine-learning model to determine a likelihood, probability, or confidence that a particular outcome (e.g., a targeted spatial or temporal energy-intensity profile of the pre-pulse laser beam 120-1, the main-pulse laser beam 120-2, the primary main-pulse laser beam 120-3, the auxiliary main-pulse laser beam 120-4, the primary pre-pulse laser beam 120-5, or the auxiliary pre-pulse laser beam 120-6, among other examples) for a subsequent EUV exposure operation will be achieved using the candidate parameters. In some implementations, the controller 702 provides data indicating a temperature, a power intensity, a targeted spatial energy-distribution profile, and/or a targeted temporal energy-intensity profile for a laser beam as input to the machine-learning model, and the controller 702 uses the machine-learning model to determine or identify a particular adjustment to operating parameters of the laser source 142 that is likely to achieve the targeted spatial energy-distribution profile and/or the targeted temporal energy-intensity profile of the laser beam.

The controller 702 (or another system) may train, update, and/or refine the machine-learning model to increase the accuracy of the outcomes and/or parameters determined using the machine-learning model. The controller 702 may train, update, and/or refine the machine-learning model based on feedback and/or results from the subsequent EUV exposure operation, as well as from historical or related EUV exposure operations (e.g., from hundreds, thousands, or more historical or related EUV exposure operations) performed by the laser source 142.

In some implementations, inputs to the machine-learning model may encompass aspects associated with laser parameters (e.g., beam energy, beam position, laser heating, beam parallelism, beam size, or pulse duration, among other examples). In some implementations, the machine-learning model encompasses aspects of a plasma quality (e.g., an ion density, an electron density, a plasma temperature, or debris generation, among other examples).

Outputs from the machine-learning model may encompass process parameters to tune an EUV exposure process on a shot-to-shot basis or a cycle-to-cycle basis. Such parameters may impact EUV radiation (e.g., light generation) and/or plasma generation.

As an example, the controller 702 may determine a correlation between a power intensity and a temperature of a primary laser source (e.g., the primary main-pulse seed laser 144-3 or the primary pre-pulse seed laser 144-5, among other examples) or between a power intensity and a temperature of an auxiliary laser source (e.g., the auxiliary main-pulse seed laser 144-4 or the auxiliary pre-pulse seed laser 144-6, among other examples).

Continuing with the example, the controller 702 may provide information relating to the correlation to update the machine-learning model to estimate a time window to toggle between the primary laser source and the auxiliary laser source. Toggling between the primary laser source and the auxiliary source based on the time window may maintain an output of the radiation source 102 to satisfy a threshold (e.g., a threshold corresponding to an approximate minimum power intensity, among other examples).

As indicated above, FIG. 7 is provided as an example. Other examples may differ from what is described with regard to FIG. 7.

Figure 8A:
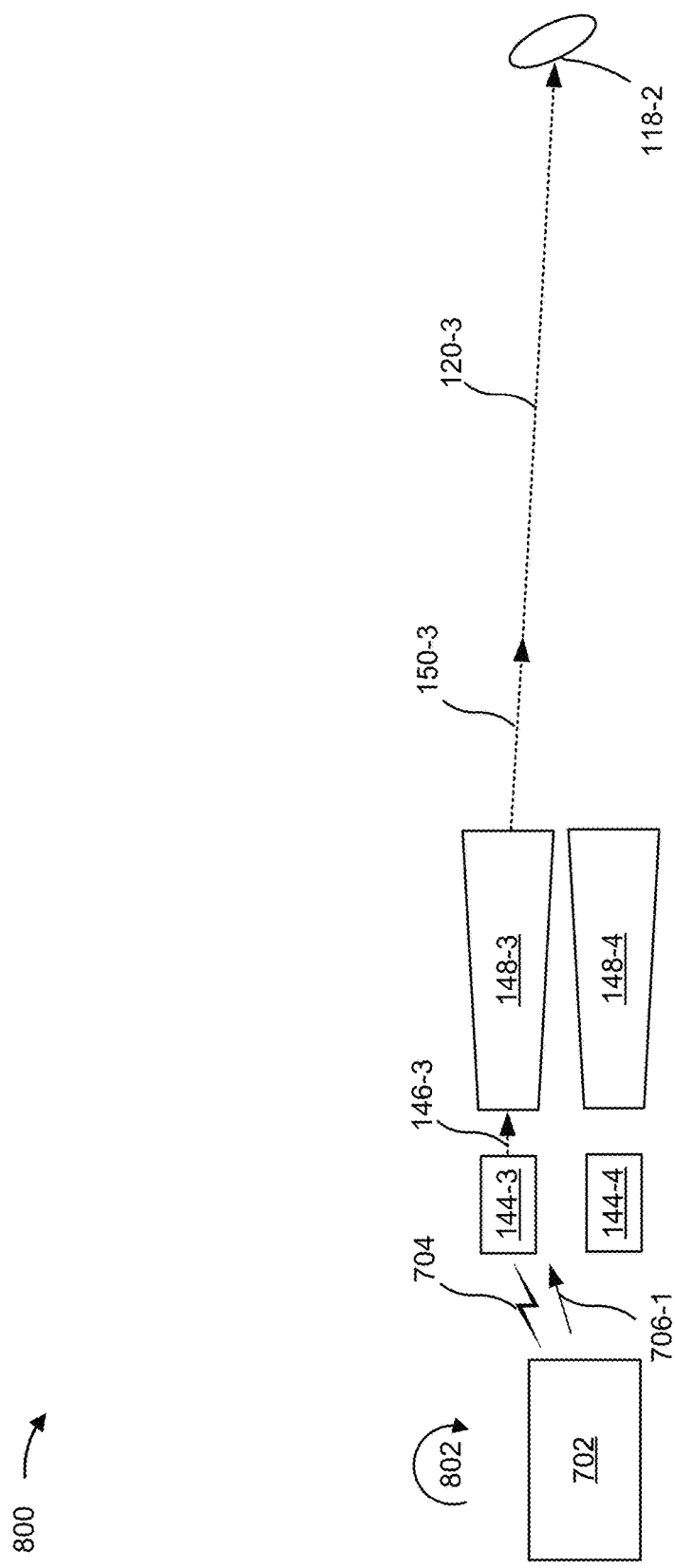
FIGS. 8A-8C are diagrams of an example implementation described herein.
Figure 8B:
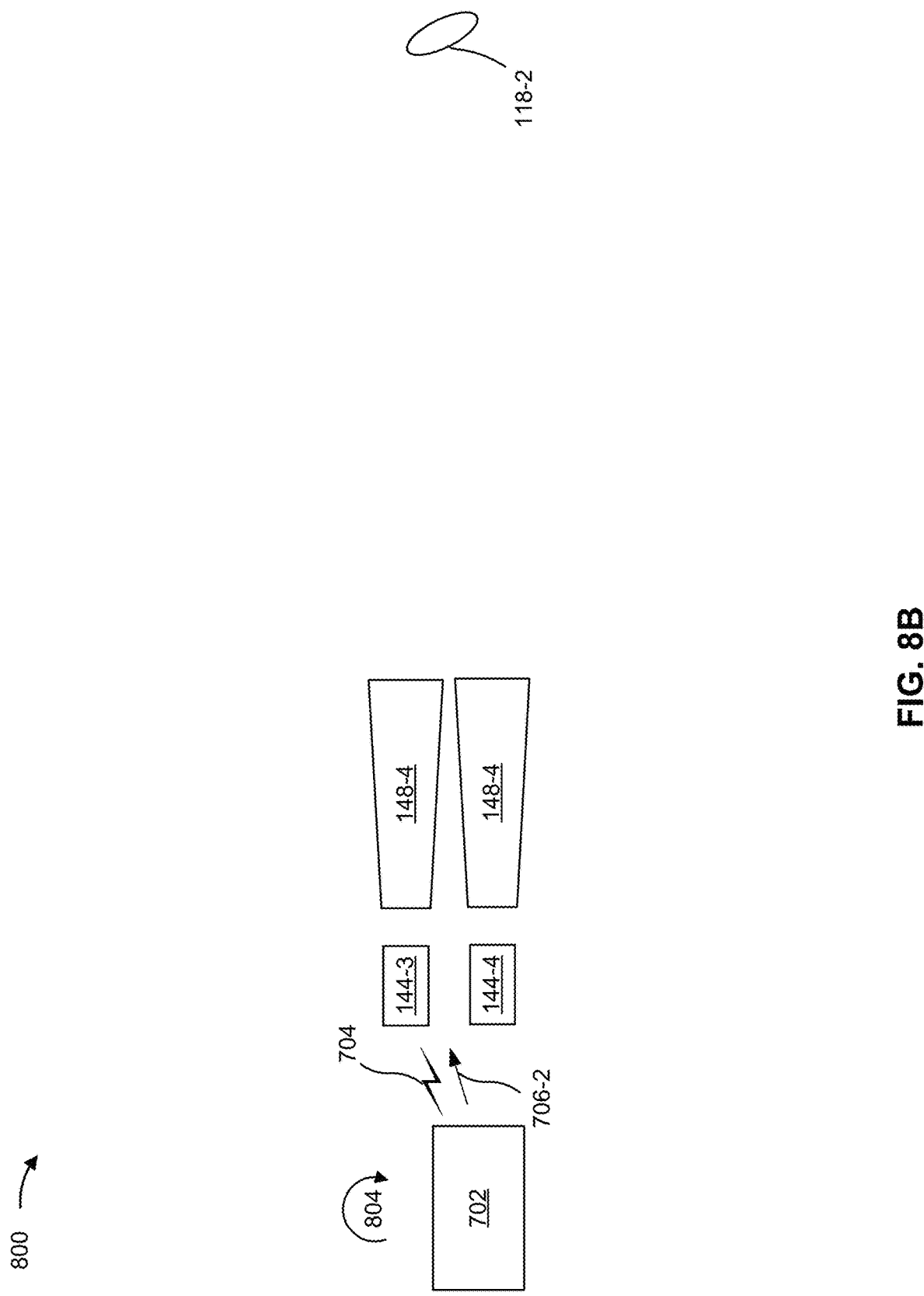
Figure 8C:
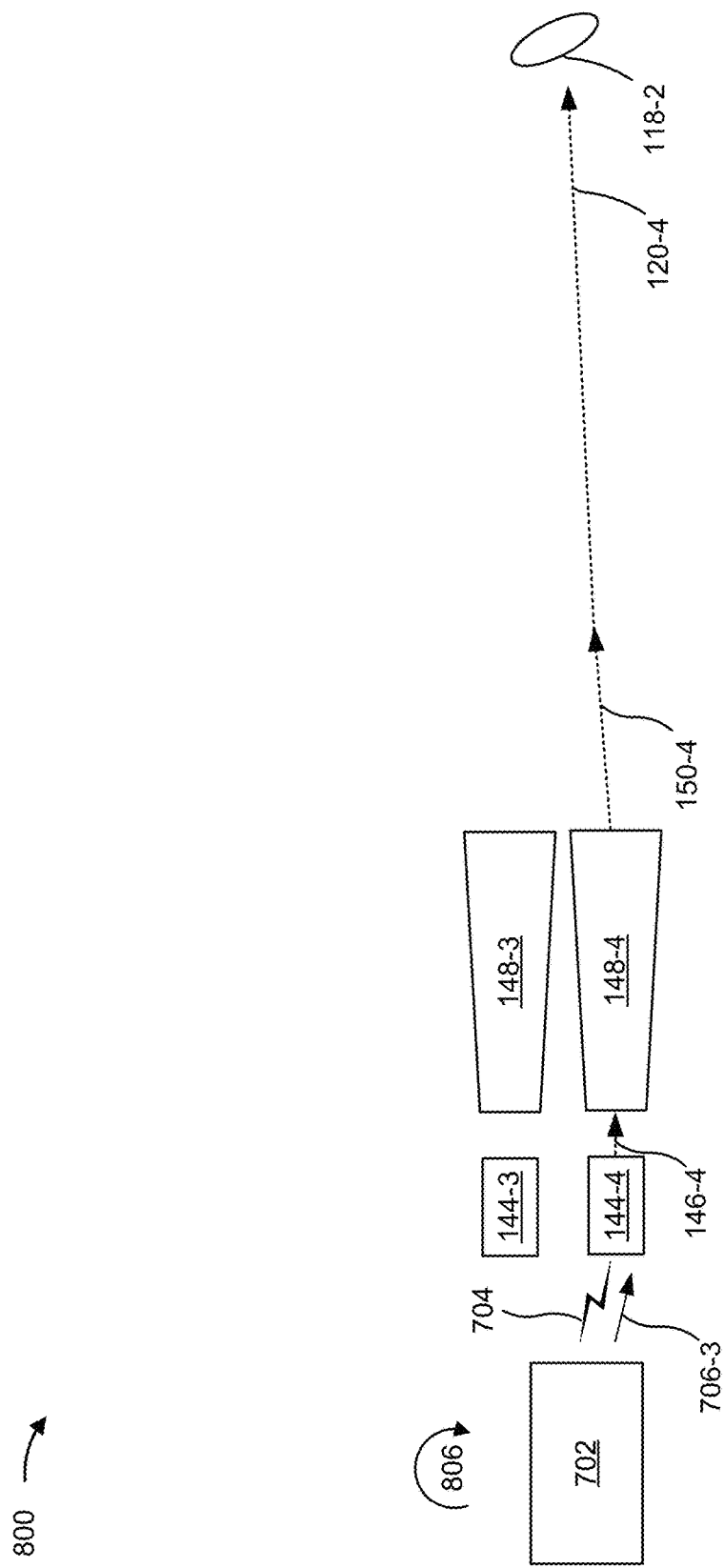

FIGS. 8A-8C are diagrams of an example implementation 800 described herein. The implementation 800 includes an example of alternating between the primary main-pulse seed laser 144-3 and the auxiliary main-pulse seed laser 144-4 so that an intensity of a laser source (e.g., the laser source 142 including the primary main-pulse seed laser 144-3 and the auxiliary main-pulse seed laser 144-4) satisfies a threshold. Although described in the context of the primary main-pulse seed laser 144-3 and the auxiliary main-pulse seed laser 144-4, processes described with regard to FIGS. 8A-8C may apply to other combinations of lasers, such as any combinations of lasers described with regards to FIGS. 5A-5F.

As shown in FIG. 8A, process 802 includes the controller 702 providing a first signal 706-1 to the primary main-pulse seed laser 144-3 using the one or more communication links 704. The first signal 706-1 may cause the primary main-pulse seed laser 144-3 to generate a first plurality of laser beams (e.g., a first plurality of laser beams including multiples of the primary main-pulse laser beam 120-3).

To generate the first plurality of the laser beams, the primary main-pulse seed laser 144-3 may provide multiples of the primary main-pulse seed laser beam 146-3 to the primary main-pulse amplifier chain 148-3. The primary main-pulse amplifier chain 148-3 may generate multiples of the primary main-pulse laser output 150-3. As shown in FIG. 8A, the plurality of the laser beams (e.g., multiples of the primary main-pulse laser beam 120-3) may correspond to the multiples of the primary main-pulse laser output 150-3 and provide energy to the plurality of droplets of a target material (e.g., multiples of the deformed droplet 118-2) to generate a plasma within a vessel of an EUV radiation source (e.g., to generate the plasma 204 within the vessel 112 of the radiation source 102). Furthermore, and as shown in FIG. 8A, the auxiliary main-pulse seed laser 144-4 is idle (e.g., in a deactivated state).

Turning to FIG. 8B, process 804 includes the controller 702 providing a second signal 706-2 to the primary main-pulse seed laser 144-3 using the one or more communication links 704. The second signal 706-2 deactivates the primary main-pulse seed laser 144-3. Furthermore, and as shown in FIG. 8B, the auxiliary main-pulse seed laser 144-4 is idle (e.g., in a deactivated state).

Turning to FIG. 8C, process 806 includes the controller 702 providing a third signal 706-3 to the auxiliary main-pulse seed laser 144-4 using the one or more communication links 704. The third signal 706-3 may cause the auxiliary main-pulse seed laser 144-4 to generate a second plurality of laser beams (e.g., a second plurality of laser beams including multiples of the auxiliary main-pulse laser beam 120-4).

To generate the second plurality of the laser beams, the auxiliary main-pulse seed laser 144-4 may provide multiples of the auxiliary main-pulse seed laser beam 146-4 to the auxiliary main-pulse amplifier chain 148-4. The auxiliary main-pulse amplifier chain 148-4 may generate multiples of the auxiliary main-pulse laser output 150-4. As shown in FIG. 8C, the plurality of the laser beams (e.g., multiples of the auxiliary main-pulse laser beam 120-4) may correspond to the multiples of the auxiliary main-pulse laser output 150-4 and provide energy to the plurality of droplets of a target material (e.g., multiples of the deformed droplet 118-2) to generate a plasma within a vessel of an EUV radiation source (e.g., to generate the plasma 204 within the vessel 112 of the radiation source 102). Furthermore, and as shown in FIG. 8C, the primary main-pulse seed laser 144-3 is idle (e.g., in a deactivated state).

Although FIGS. 8A-8C show an implementation where the auxiliary main-pulse seed laser 144-4 generates the second plurality of laser beams after the primary main-pulse seed laser 144-3 generates the first plurality of laser beams, processes to deactivate the primary main-pulse seed laser 144-3 and to activate the auxiliary main-pulse seed laser 144-4 may overlap to continually supply energy to the plurality of the droplets of the target material (e.g., to maintain a synchronization of main-pulse laser beams with the plurality of the droplets of the target material as the plurality of the droplets traverse the path 202). As an example, the second signal 706-2 may include information to cause the primary main-pulse seed laser 144-3 to continue pulsing for a short duration as the auxiliary main-pulse seed laser 144-4 activates. In such a case the third signal 706-3 may include information that causes the auxiliary main-pulse laser to generate, for a short duration, the second plurality of laser beams (e.g. the second plurality of laser beams including multiples of the auxiliary main-pulse laser beam 120-4) concurrently with a subset of the first plurality of beams (e.g., a subset of the first plurality of laser beams including multiples of the primary main-pulse laser beam 120-3).

In some implementations, activating and deactivating the primary main-pulse seed laser 144-3, as well as activating and deactivating the auxiliary main-pulse seed laser 144-4, includes providing signaling based on a timing offset (e.g., the timing offset 612). Alternatively or in addition, activating and deactivating the primary main-pulse seed laser 144-3, as well as activating and deactivating the auxiliary main-pulse seed laser 144-4, includes providing signaling based on detecting a degradation of a power intensity of the primary main-pulse seed laser 144-3 and/or the auxiliary main-pulse seed laser 144-4.

As indicated above, FIGS. 8A-8C are provided as an example. Other examples may differ from what is described with regard to FIGS. 8A-8C.

Figure 9:
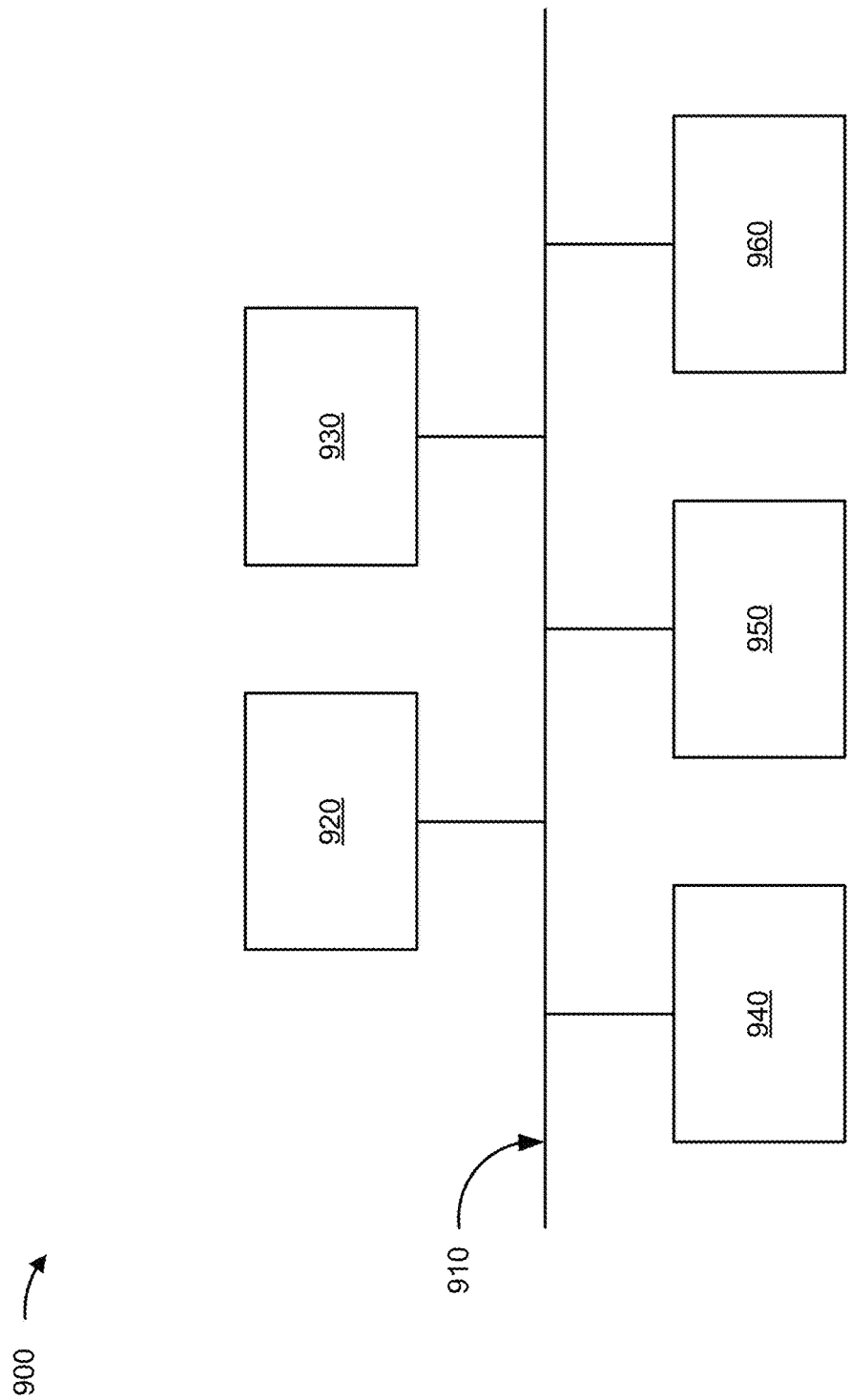
FIG. 9 is a diagram of example components of one or more devices described herein.

FIG. 9 is a diagram of example components of one or more devices 900 described herein. The devices 900 may correspond to the lithography system 100, the radiation source 102, the laser source 142, and/or the controller 702. In some implementations, the lithography system 100, the radiation source 102, the laser source 142, and/or the controller 702 include one or more devices 900 and/or one or more components of device 900. As shown in FIG. 9, device 900 may include a bus 910, a processor 920, a memory 930, an input component 940, an output component 950, and a communication component 960.

Bus 910 includes one or more components that enable wired and/or wireless communication among the components of device 900. Bus 910 may couple together two or more components of FIG. 9, such as via operative coupling, communicative coupling, electronic coupling, and/or electric coupling. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform one or more operations or processes described elsewhere herein.

Memory 930 includes volatile and/or nonvolatile memory. For example, memory 930 may include random access memory (RAM), read only memory (ROM), a hard disk drive, and/or another type of memory (e.g., a flash memory, a magnetic memory, and/or an optical memory). Memory 930 may include internal memory (e.g., RAM, ROM, or a hard disk drive) and/or removable memory (e.g., removable via a universal serial bus connection). Memory 930 may be a non-transitory computer-readable medium. Memory 930 stores information, instructions, and/or software (e.g., one or more software applications) related to the operation of device 900. In some implementations, memory 930 includes one or more memories that are coupled to one or more processors (e.g., processor 920), such as via bus 910.

Input component 940 enables device 900 to receive input, such as user input and/or sensed input. For example, input component 940 may include a touch screen, a keyboard, a keypad, a mouse, a button, a microphone, a switch, a sensor, a global positioning system sensor, an accelerometer, a gyroscope, and/or an actuator. Output component 950 enables device 900 to provide output, such as via a display, a speaker, and/or a light-emitting diode. Communication component 960 enables device 900 to communicate with other devices via a wired connection and/or a wireless connection. For example, communication component 960 may include a receiver, a transmitter, a transceiver, a modem, a network interface card, and/or an antenna.

Device 900 may perform one or more operations or processes described herein. For example, a non-transitory computer-readable medium (e.g., memory 930) may store a set of instructions (e.g., one or more instructions or code) for execution by processor 920. Processor 920 may execute the set of instructions to perform one or more operations or processes described herein. In some implementations, execution of the set of instructions, by one or more processors 920, causes the one or more processors 920 and/or the device 900 to perform one or more operations or processes described herein. In some implementations, hardwired circuitry is used instead of or in combination with the instructions to perform one or more operations or processes described herein. Additionally, or alternatively, processor 920 may be configured to perform one or more operations or processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
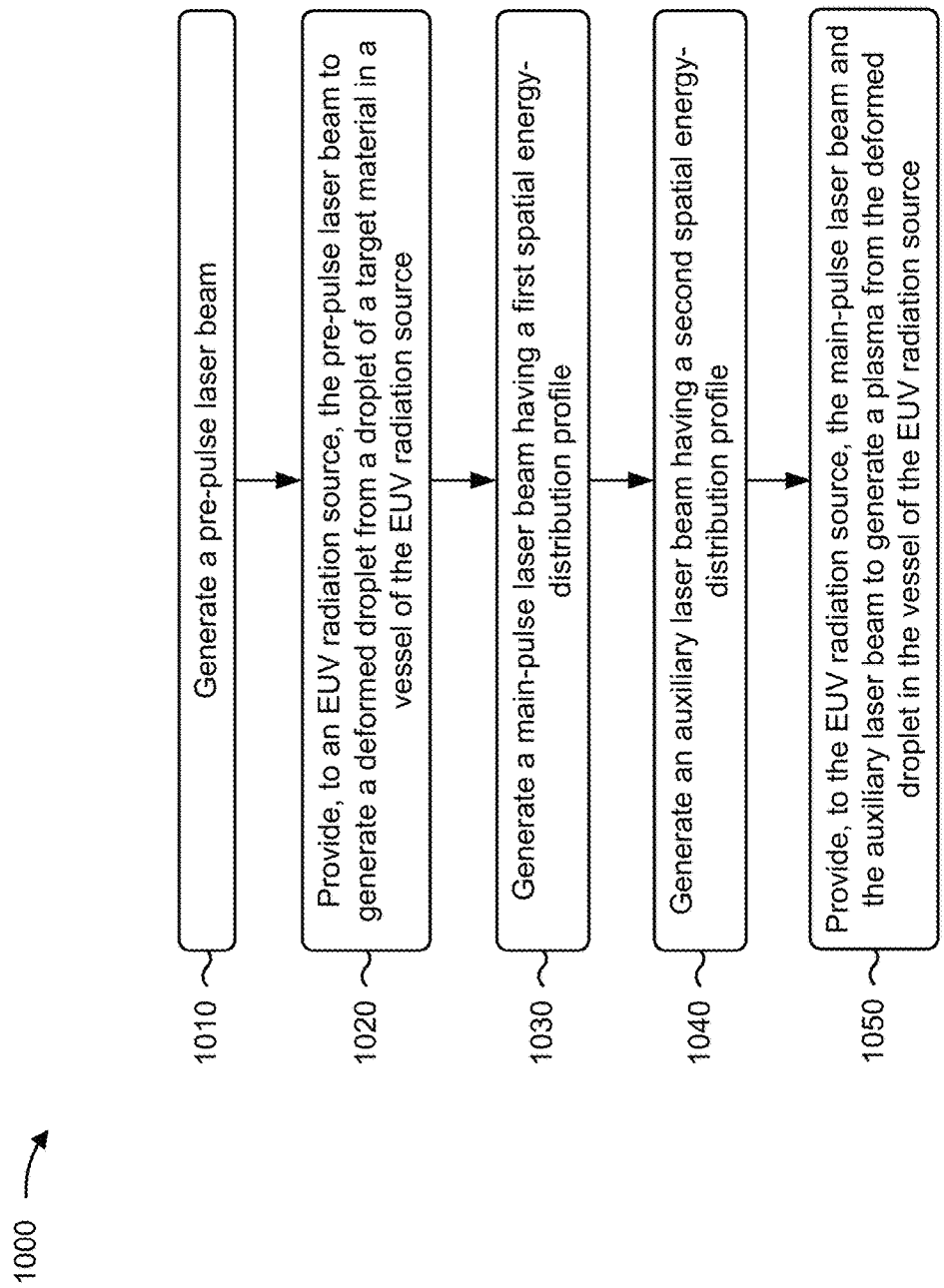

FIG. 10 is a flowchart of an example process 1000 relating to generating and providing laser beams to the radiation source 102 of the lithography system 100 described herein. In some implementations, one or more process blocks of FIG. 10 are performed by a device (e.g., the lithography system 100, the radiation source 102, the laser source 142, and/or the controller 702, among other examples). In some implementations, one or more process blocks of FIG. 10 are performed by another device or a group of devices separate from or including the device, such as a seed laser (e.g., one or more of the seed lasers 144-1 through 144-4, among other examples), an amplifier chain (e.g., one or more of the amplifier chains 148-1 through 148-6, among other examples), and/or an optical component (e.g., the main-pulse optical component 504-1 or the pre-pulse optical component 504-2, among other examples). Additionally, or alternatively, one or more process blocks of FIG. 10 may be performed by one or more components of device 900, such as processor 920, memory 930, input component 940, output component 950, and/or communication component 960.

As shown in FIG. 10, process 1000 may include generating a pre-pulse laser beam (block 1010). For example, the laser source 142 may generate a pre-pulse laser beam 120-1, as described in connection with FIGS. 5A and 5C, and/or elsewhere herein.

As further shown in FIG. 10, process 1000 may include providing, to an EUV radiation source, the pre-pulse laser beam to generate a deformed droplet from a droplet of a target material in a vessel of the EUV radiation source (block 1020). For example, the laser source 142 may provide, to a radiation source 102, the pre-pulse laser beam 120-1 to generate a deformed droplet 118-2 from a droplet 118-1 of a target material in a vessel 112 of the radiation source 102, as described in connection with FIGS. 5A and 5C, and/or elsewhere herein.

As further shown in FIG. 10, process 1000 may include generating a main-pulse laser beam having a first spatial energy-distribution profile (block 1030). For example, the laser source 142 may generate a primary main-pulse laser beam 120-3 having a first spatial energy-distribution profile 318-1, as described in connection with FIGS. 5A, 5C, 5E, and 5F, and/or elsewhere herein.

As further shown in FIG. 10, process 1000 may include generating an auxiliary laser beam having a second spatial energy-distribution profile (block 1040). For example, the laser source 142 may generate an auxiliary main-pulse laser beam 120-4 having a second spatial energy-distribution profile 320-1, as described in connection with FIGS. 5A, 5C, 5E, and 5F, and/or elsewhere herein. In some implementations, the second spatial energy-distribution profile 320-1 is based on the first spatial energy-distribution profile 318-1 to achieve a target spatial energy-distribution profile for a combination of the primary main-pulse laser beam 120-3 and the auxiliary main-pulse laser beam 120-4 (e.g., the combined main-pulse spatial energy-distribution profile 322-1).

As further shown in FIG. 10, process 1000 may include providing, to the EUV radiation source, the main-pulse laser beam and the auxiliary laser beam to generate a plasma from the deformed droplet in the vessel of the EUV radiation source (block 1050). For example, the laser source 142 may provide, to the radiation source 102, the primary main-pulse laser beam 120-3 and the auxiliary main-pulse laser beam 120-4 to generate a plasma 204 from the deformed droplet 118-2 in the vessel 112 of the radiation source 102, as described in connection with FIGS. 5A, 5C, 5E, and 5F, and/or elsewhere herein.

Process 1000 may include additional implementations, such as any single implementation or any combination of implementations described below and/or in connection with one or more other processes described elsewhere herein.

In a first implementation, the laser source 142 generating the pre-pulse laser beam 120-1 includes generating the pre-pulse laser beam 120-1 using a first seed laser 144-1 and a first amplifier chain 148-1, as described in connection with FIGS. 5A and 5C, and/or elsewhere herein. In some implementations, the first seed laser 144-1 and one or more second seed lasers 144-2 that are used to generate the primary main-pulse laser beam 120-3 and the auxiliary main-pulse laser beam 120-4 are different seed lasers, and the first amplifier chain 148-1 and one or more second amplifier chains 148-2 that are used to generate the primary main-pulse laser beam 120-3 and the auxiliary main-pulse laser beam 120-4 are different amplifier chains.

In a second implementation, alone or in combination with the first implementation, the laser source 142 generating the primary main-pulse laser beam 120-3 and generating the auxiliary main-pulse laser beam 120-4 includes generating, using a main-pulse seed laser 144-2 and a main-pulse amplifier chain 148-2, a laser output 150-2, and splitting, using an optical component 504-1, the laser output 150-2 into a first portion and a second portion, as described in connection with FIGS. 5A, 5D, and 5E, and/or elsewhere herein. In some implementations, the first portion is used to generate the primary main-pulse laser beam 120-3. In some implementations, the optical component 504-1 rotates the second portion to generate the auxiliary main-pulse laser beam 120-4.

In a third implementation, alone or in combination with one or more of the first and second implementations, the laser source 142 generating the auxiliary main-pulse laser beam 120-4 includes the laser source 142 generating multiple auxiliary main-pulse laser beams using multiple seed lasers and multiple corresponding amplifier chains and combining the multiple auxiliary main-pulse laser beams to generate the auxiliary main-pulse laser beam 120-4.

In a fourth implementation, alone or in combination with one or more of the first through third implementations, the laser source generating the primary main-pulse laser beam 120-3 includes generating the primary main-pulse laser beam 120-3 using a first seed laser 144-3 and a first amplifier chain 148-3, as described in connection with FIGS. 5C and 5F, and/or elsewhere herein. In some implementations, the first seed laser 144-3 and one or more second seed lasers 144-1, 144-4 that are used to generate the pre-pulse laser beam 120-1 and the auxiliary main-pulse laser beam 120-4 are different seed lasers, and the first amplifier chain 148-3 and one or more second amplifier chains 148-1, 148-4 that are used to generate the pre-pulse laser beam 120-1 and the auxiliary main-pulse laser beam 120-4 are different amplifier chains.

In a fifth implementation, alone or in combination with one or more of the first through fourth implementations, the laser source 142 generating the auxiliary main-pulse laser beam 120-4 includes generating the auxiliary main-pulse laser beam 120-4 using a first seed laser 144-4 and a first amplifier chain 148-4, as described in connection with FIGS. 5C and 5F, and/or elsewhere herein. In some implementations, the first seed laser 144-4 and one or more second seed lasers 144-3, 144-1 that are used to generate the primary main-pulse laser beam 120-3 and the pre-pulse laser beam 120-1 are different seed lasers, and the first amplifier chain 148-4 and one or more second amplifier chains 148-3, 148-1 that are used to generate the primary main-pulse laser beam 120-3 and the pre-pulse laser beam 120-1 are different amplifier chains.

In a sixth implementation, alone or in combination with one or more of the first through fifth implementations the laser source 142 generating the primary main-pulse laser beam 120-3 and generating the auxiliary main-pulse laser beam 120-4 respectively includes generating the primary main-pulse laser beam 120-3 based on a first signal 410-2 to activate the primary main-pulse laser beam 120-3 at a first time 414-2 and to deactivate the primary main-pulse laser beam 120-3 at a second time 416-2, generating the auxiliary main-pulse laser beam 120-4 based on a second signal 412-2 to activate the auxiliary main-pulse laser beam 120-4 at a third time 413-3 and to deactivate the auxiliary main-pulse laser beam 120-4 at a fourth time 416-3, as described in connection with FIGS. 4B, 5A, 5C, 5E, 5F, and 8A-8C, and/or elsewhere herein. In some implementations, a first duration between the first time 414-2 and the second time 416-2 is different than a second duration between the third time 413-3 and the fourth time 416-3.

Although FIG. 10 shows example blocks of process 1000, in some implementations, process 1000 includes additional blocks, fewer blocks, different blocks, or differently arranged blocks than those depicted in FIG. 10. Additionally, or alternatively, two or more of the blocks of process 1000 may be performed in parallel.

Figure 11:
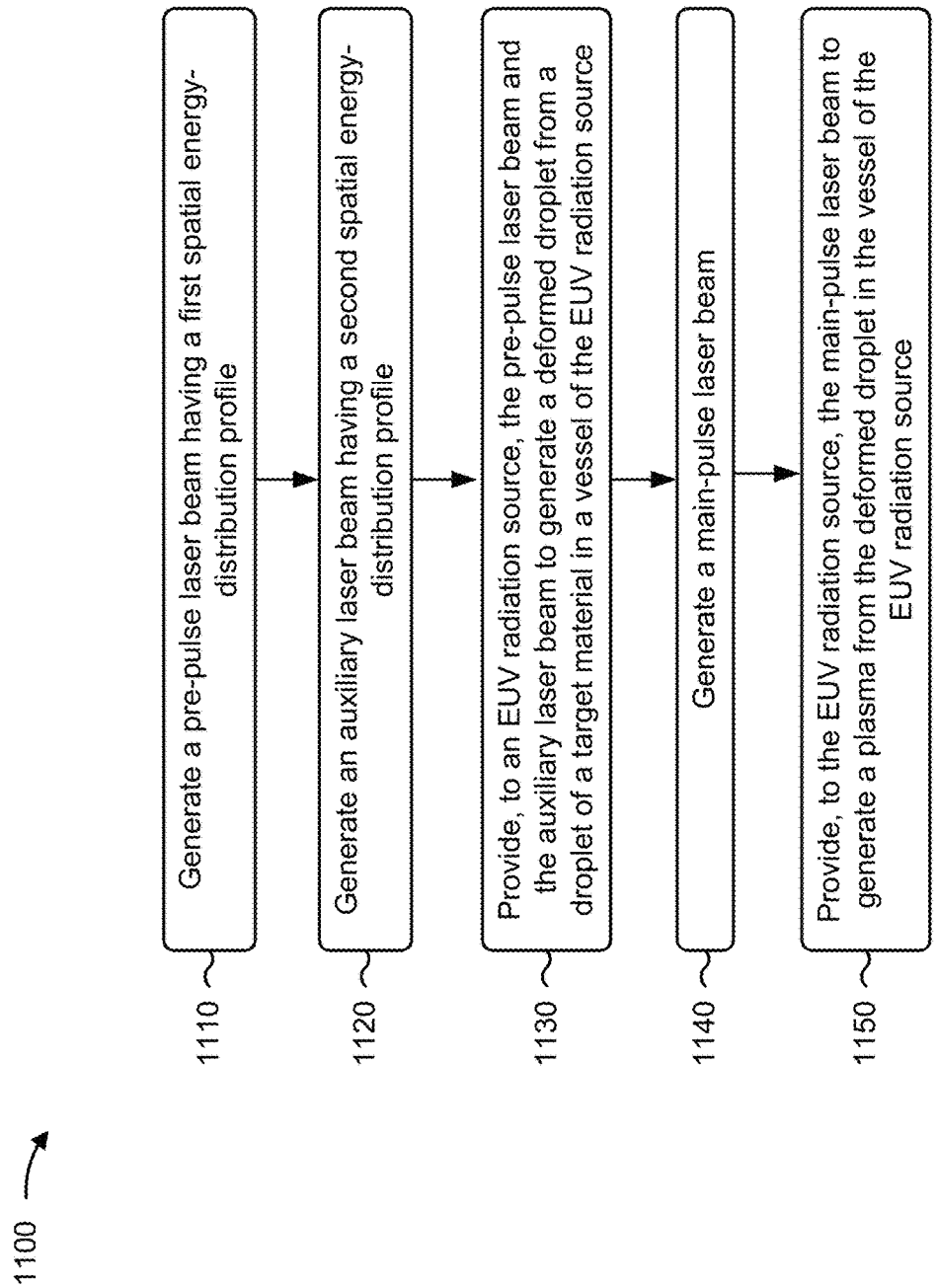

FIG. 11 is a flowchart of an example process 1100 relating to generating and providing laser beams to the radiation source 102 of the lithography system 100 described herein. In some implementations, one or more process blocks of FIG. 11 are performed by a device (e.g., the lithography system 100, the radiation source 102, the laser source 142, and/or the controller 702, among other examples). In some implementations, one or more process blocks of FIG. 11 are performed by another device or a group of devices separate from or including the device, such as a seed laser (e.g., one or more of the seed lasers 144-1 through 144-4, among other examples), an amplifier chain (e.g., one or more of the amplifier chains 148-1 through 148-6, among other examples), and/or an optical component (e.g., the main-pulse optical component 504-1 or the pre-pulse optical component 504-2, among other examples). Additionally, or alternatively, one or more process blocks of FIG. 11 may be performed by one or more components of device 900, such as processor 920, memory 930, input component 940, output component 950, and/or communication component 960.

As shown in FIG. 11, process 1100 may include generating a pre-pulse laser beam having a first spatial energy-distribution profile (block 1110). For example, the laser source 142 may generate a primary pre-pulse laser beam 120-5 having a first spatial energy-distribution profile 318-2, as described in connection with FIGS. 5B, 5D, 5E, and 5F, and/or elsewhere herein.

As further shown in FIG. 11, process 1100 may include generating an auxiliary laser beam having a second spatial energy-distribution profile (block 1120). For example, the laser source 142 may generate an auxiliary pre-pulse laser beam 120-6 having a second spatial energy-distribution profile 320-2, as described in connection with FIGS. 5B, 5D, 5E, and 5F, and/or elsewhere herein. In some implementations, the second spatial energy-distribution profile 320-2 is based on the first spatial energy-distribution profile 318-2 to achieve a target spatial energy-distribution profile for a combination of the primary pre-pulse laser beam 120-5 and the auxiliary pre-pulse laser beam 120-6 (e.g., the combined pre-pulse spatial energy-distribution profile 322-2).

As further shown in FIG. 11, process 1100 may include providing, to an EUV radiation source, the pre-pulse laser beam and the auxiliary laser beam to generate a deformed droplet from a droplet of a target material in a vessel of the EUV radiation source (block 1130). For example, the laser source 142 may provide, to the radiation source 102, the primary pre-pulse laser beam 120-5 and the auxiliary pre-pulse laser beam 120-6 to generate a deformed droplet 118-2 from a droplet 118-1 of a target material in a vessel 112 of the radiation source 102, as described in connection with 5B, 5D, 5E, and 5F, and/or elsewhere herein.

As further shown in FIG. 11, process 1100 may include generating a main-pulse laser beam (block 1140). For example, the laser source 142 may generate a main-pulse laser beam 120-2, as described in connection with FIGS. 5B and 5D, and/or elsewhere herein.

As further shown in FIG. 11, process 1100 may include providing, to the EUV radiation source, the main-pulse laser beam to generate a plasma from the deformed droplet in the vessel of the EUV radiation source (block 1150). For example, the laser source 142 may provide, to the radiation source 102, the main-pulse laser beam 120-2 to generate a plasma 204 from the deformed droplet 118-2 in the vessel 112 of the radiation source 102, as described in connection with FIGS. 5B and 5D, and/or elsewhere herein.

Process 1100 may include additional implementations, such as any single implementation or any combination of implementations described below and/or in connection with one or more other processes described elsewhere herein.

In a first implementation, the laser source 142 generating the primary pre-pulse laser beam 120-5 includes generating the primary pre-pulse laser beam 120-5 using a first seed laser 144-5 and a first amplifier chain 148-5, as described in connection with FIGS. 5D and 5F, and/or elsewhere herein. In some implementations, the first seed laser 144-5 and one or more second seed lasers 144-2, 144-6 that are used to generate the main-pulse laser beam 120-2 and the auxiliary pre-pulse laser beam 120-6 are different seed lasers, and the first amplifier chain 148-5 and one or more second amplifier chains 148-2, 148-6 that are used to generate the main-pulse laser beam 120-2 and the auxiliary pre-pulse laser beam 120-6 are different amplifier chains.

In a second implementation, alone or in combination with the first implementation, the laser source 142 generating the primary pre-pulse laser beam 120-5 and the auxiliary pre-pulse laser beam 120-6 respectively includes generating, using a first seed laser 144-1 and a first amplifier chain 148-1, a laser output 150-1 including a first wavelength to generate the primary pre-pulse laser beam 120-5 and generating, using a second seed laser, and splitting, using an optical component 504-2, the laser output 150-1 into a first portion and a second portion, as described in connection with FIGS. 5B and 5E, and/or elsewhere herein. In some implementations, the first portion is used to generate the primary pre-pulse laser beam 120-5.

In a third implementation, alone or in combination with one or more of the first and second implementations, the laser source 142 generating the primary pre-pulse laser beam 120-5 and the auxiliary pre-pulse laser beam 120-6 respectively includes generating, using a first seed laser 144-5 and a first amplifier chain 148-5, a first laser output 150-5 including a pulse wave to generate the primary pre-pulse laser beam 120-5 and generating, using a second seed laser 144-6 and a second amplifier chain 148-6, a second laser output 150-6 including a continuous wave to generate the auxiliary pre-pulse laser beam 120-6.

In a fourth implementation, alone or in combination with one or more of the first through third implementations, the laser source 142 generating the main-pulse laser beam 120-2 includes generating the main-pulse laser beam 120-2 using a first seed laser 144-2 and a first amplifier chain 148-2, as described in connection with FIGS. 5B and 5D, and/or elsewhere herein. In some implementations, the first seed laser 144-2 and one or more second seed lasers 144-5, 144-6 that are used to generate the primary pre-pulse laser beam 120-5 and the auxiliary pre-pulse laser beam 120-6 are different seed lasers, and the first amplifier chain 148-2 and one or more second amplifier chains 148-5, 148-6 that are used to generate the primary pre-pulse laser beam 120-5 and the auxiliary pre-pulse laser beam 120-6 are different amplifier chains.

In a fifth implementation, alone or in combination with one or more of the first through fourth implementations, the laser source 142 generating the auxiliary pre-pulse laser beam 120-6 includes generating the auxiliary pre-pulse laser beam 120-6 using a first seed laser 144-6 and a first amplifier chain 148-6, as described in connection with FIGS. 5D and 5F, and/or elsewhere herein. In some implementations, the first seed laser 144-6 and one or more second seed lasers 144-2, 144-5 that are used to generate the main-pulse laser beam 120-2 and the primary pre-pulse laser beam 120-5 are different seed lasers, and the first amplifier chain 148-6 and one or more second amplifier chains 148-2, 148-5 that are used to generate the main-pulse laser beam 120-2 and the primary pre-pulse laser beam 120-5 are different amplifier chains.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

Figure 12:
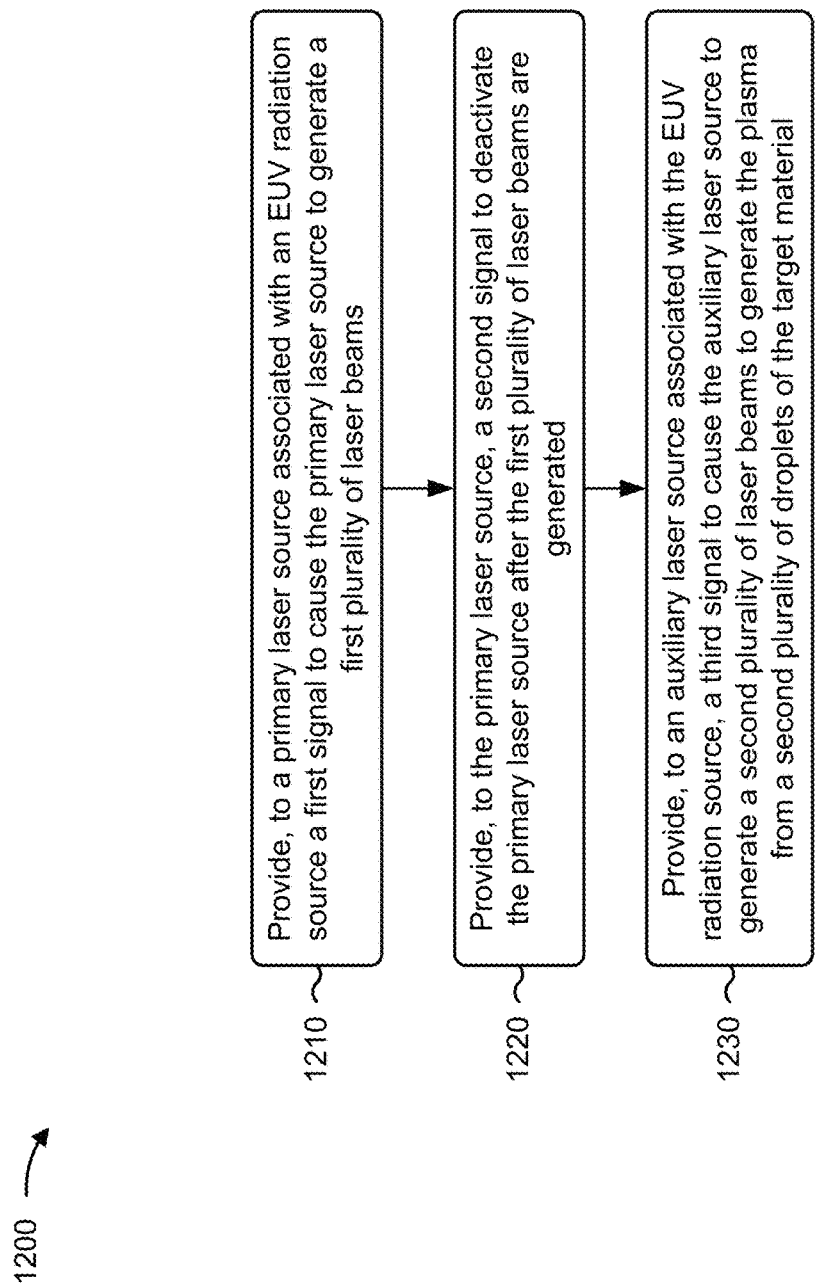

FIG. 12 is a flowchart of an example process 1200 relating to generating and providing laser beams to the radiation source 102 of the lithography system 100 described herein. In some implementations, one or more process blocks of FIG. 12 are performed by a device (e.g., the lithography system 100, the radiation source 102, the laser source 142, and/or the controller 702, among other examples). In some implementations, one or more process blocks of FIG. 12 are performed by another device or a group of devices separate from or including the device, such as a seed laser (e.g., one or more of the seed lasers 144-1 through 144-4, among other examples), an amplifier chain (e.g., one or more of the amplifier chains 148-1 through 148-6, among other examples), and/or an optical component (e.g., the main-pulse optical component 504-1 or the pre-pulse optical component 504-2, among other examples). Additionally, or alternatively, one or more process blocks of FIG. 12 may be performed by one or more components of device 900, such as processor 920, memory 930, input component 940, output component 950, and/or communication component 960.

As shown in FIG. 12, process 1200 may include providing, to a primary laser source associated with an EUV radiation source a first signal to cause the primary laser source to generate a first plurality of laser beams (block 1210). For example, the controller 702 may provide, to a primary main-pulse seed laser 144-3 associated with a radiation source 102, a first signal 706-1 to cause the primary main-pulse seed laser 144-3 to generate a first plurality of laser beams 120-3, as described above. In some implementations, the first plurality of laser beams 120-3 are to be used to generate, from a first plurality of droplets 118-2 of a target material, a plasma 204 within a vessel 112 of the radiation source 102, as described in connection with FIGS. 5C, 5F, and 8A, and/or elsewhere herein.

As further shown in FIG. 12, process 1200 may include providing, to the primary laser source, a second signal to deactivate the primary laser source after the first plurality of laser beams are generated (block 1220). For example, the controller 702 may provide, to the primary main-pulse seed laser 144-3, a second signal 706-2 to deactivate the primary main-pulse seed laser 144-3 after the first plurality of laser beams 120-2 are generated, as described in connection with FIGS. 5C, 5F, and 8B, and/or elsewhere herein.

As further shown in FIG. 12, process 1200 may include providing, to an auxiliary laser source associated with the EUV radiation source, a third signal to cause the auxiliary laser source to generate a second plurality of laser beams to generate the plasma from a second plurality of droplets of the target material (block 1230). For example, the controller 702 may provide, to an auxiliary main-pulse seed laser 144-4 associated with the radiation source 102, a third signal 706-3 to cause the auxiliary main-pulse seed laser 144-4 to generate a second plurality of laser beams 120-4 to generate the plasma 204 from a second plurality of droplets 118-2 of the target material, as described in connection with FIGS. 5C, 5F, and 8C, and/or elsewhere herein. In some implementations, the third signal 706-3 is to cause the auxiliary main-pulse seed laser 144-4 to generate the second plurality of laser beams 120-4 at least one of: concurrently with the primary main-pulse seed laser 144-3 generating a subset of the first plurality of laser beams 120-3, or after the primary main-pulse seed laser 144-3 finishes generating the first plurality of laser beams 120-3.

Process 1200 may include additional implementations, such as any single implementation or any combination of implementations described below and/or in connection with one or more other processes described elsewhere herein.

In a first implementation, providing the second signal 706-2 to deactivate the primary laser source (e.g., the primary main-pulse seed laser 144-3) includes providing the second signal 706-2 to deactivate the primary laser source based on a timing offset 612, and providing the third signal 706-3 to cause the auxiliary laser source (e.g., the auxiliary main-pulse seed laser 144-4) to generate the second plurality of laser beams 120-4 includes providing the third signal 706-3 to cause the auxiliary laser source to generate the second plurality of laser beams 120-4 based on the timing offset 612, as described in connection with FIG. 6, FIG. 8B, and FIG. 8C, and/or elsewhere herein.

In a second implementation, alone or in combination with the first implementation, providing the second signal 706-2 to deactivate the primary laser source (e.g., the primary main-pulse seed laser 144-3) and providing the third signal 706-3 to cause the auxiliary laser source (e.g., the auxiliary main-pulse seed laser 144-4) to generate the second plurality of laser beams 120-4 includes detecting a degradation of a power intensity of the first plurality of laser beams 120-3, and providing, based on detecting the degradation of the power intensity, the second signal 706-2 to deactivate the primary laser source, and the third signal 706-3 to cause the auxiliary laser source to generate the second plurality of laser beams 120-4, as described in connection with FIGS. 8A-8C, and/or elsewhere herein.

In a third implementation, alone or in combination with one or more of the first and second implementations, process 1200 includes providing a fourth signal to deactivate the auxiliary laser source (e.g., the auxiliary main-pulse seed laser 144-4) after the second plurality of laser beams are generated, and providing a fifth signal to cause the primary laser source (e.g., the primary main-pulse seed laser 144-3) to generate a third plurality of laser beams to generate the plasma from a third plurality droplets of the target material. In some implementations, the fifth signal is to cause the primary laser source to generate the third plurality of laser beams at least one of concurrently with the auxiliary laser source generating a subset of the second plurality of laser beams 120-4, or after the auxiliary laser source finishes generating the second plurality of laser beams 120-4.

In a fourth implementation, alone or in combination with one or more of the first through third implementations, process 1200 includes determining a correlation between a power intensity and a temperature of the primary laser source (e.g., the primary main-pulse seed laser 144-3), or the auxiliary laser source (e.g., the auxiliary main-pulse seed laser 144-4), and providing information relating to the correlation to update a machine-learning model that estimates a time window to toggle between the primary laser source and the auxiliary laser source to maintain an output of the EUV radiation source to satisfy a threshold.

In a fifth implementation, alone or in combination with one or more of the first through fourth implementations, the first plurality of laser beams and the second plurality of laser beams respectively provide energy to the first plurality of droplets and energy to the second plurality of droplets as part of a pre-pulse process that shapes the first plurality of droplets and the second plurality of droplets as part of generating the plasma 204.

In a sixth implementation, alone or in combination with one or more of the first through fifth implementations, the first plurality of laser beams and the second plurality of laser beams respectively provide energy to the first plurality of droplets and energy to the second plurality of droplets as part of a main-pulse process that vaporizes and ionizes the first plurality of droplets and the second plurality of droplets as part of generating the plasma.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

FIG. 13 is a flowchart of an example process 1300 relating to generating and providing laser beams to the radiation source 102 of the lithography system 100 described herein. In some implementations, one or more process blocks of FIG. 13 are performed by a device (e.g., the lithography system 100, the radiation source 102, the laser source 142, and/or the controller 702, among other examples). In some implementations, one or more process blocks of FIG. 13 are performed by another device or a group of devices separate from or including the device, such as a seed laser (e.g., one or more of the seed lasers 144-1 through 144-4, among other examples), an amplifier chain (e.g., one or more of the amplifier chains 148-1 through 148-6, among other examples), and/or an optical component (e.g., the main-pulse optical component 504-1 or the pre-pulse optical component 504-2, among other examples). Additionally, or alternatively, one or more process blocks of FIG. 13 may be performed by one or more components of device 900, such as processor 920, memory 930, input component 940, output component 950, and/or communication component 960.

As shown in FIG. 13, process 1300 may include receiving a semiconductor substrate coated with a photoresist material (block 1310). For example, the lithography system 100 may receive a semiconductor substrate 110 coated with a photoresist material, as described above.

As further shown in FIG. 13, process 1300 may include exposing the semiconductor substrate to light generated by a plasma in an EUV radiation source, (block 1320). For example, the lithography system 100 may expose the semiconductor substrate 110 to light (e.g., the radiation 106) generated by a plasma 204 in an EUV radiation source (e.g., the radiation source 102), as described above.

In some implementations, generating the plasma 204 includes generating a pre-pulse laser beam having a first spatial energy-distribution profile. For example, the laser source 142 may generate a primary pre-pulse laser beam 120-5 having a first spatial energy-distribution profile 318-2, as described in connection with FIGS. 5B, 5D, 5E, and 5F, and/or elsewhere herein.

Additionally, or alternatively, generating the plasma 204 includes generating an auxiliary laser beam having a second spatial energy-distribution profile. For example, the laser source 142 may generate an auxiliary pre-pulse laser beam 120-6 having a second spatial energy-distribution profile 320-2, as described in connection with FIGS. 5B, 5D, 5E, and 5F, and/or elsewhere herein. In some implementations, the second spatial energy-distribution profile 320-2 is based on the first spatial energy-distribution profile 318-2 to achieve a target spatial energy-distribution profile for a combination of the primary pre-pulse laser beam 120-5 and the auxiliary pre-pulse laser beam 120-6 (e.g., the combined pre-pulse spatial energy-distribution profile 322-2).

Generating the plasma 204 may include providing, to the EUV radiation source, the pre-pulse laser beam and the auxiliary laser beam to generate a deformed droplet from a droplet of a target material in a vessel of the EUV radiation source. For example, the laser source 142 may provide, to the radiation source 102, the primary pre-pulse laser beam 120-5 and the auxiliary pre-pulse laser beam 120-6 to generate a deformed droplet 118-2 from a droplet 118-1 of a target material in a vessel 112 of the radiation source 102, as described in connection with 5B, 5D, 5E, and 5F, and/or elsewhere herein.

In some implementations, generating the plasma 204 includes generating a main-pulse laser beam. For example, the laser source 142 may generate a main-pulse laser beam 120-2, as described in connection with FIGS. 5B and 5D, and/or elsewhere herein.

Additionally, or alternatively, generating the plasma 204 may include providing, to the EUV radiation source, the main-pulse laser beam to generate the plasma 204 from the deformed droplet in the vessel of the EUV radiation source. For example, the laser source 142 may provide, to the radiation source 102, the main-pulse laser beam 120-2 to generate the plasma 204 from the deformed droplet 118-2 in the vessel 112 of the radiation source 102, as described in connection with FIGS. 5B and 5D, and/or elsewhere herein.

Process 1300 may include additional implementations, such as any single implementation or any combination of implementations described below and/or in connection with one or more other processes described elsewhere herein.

In a first implementation, the laser source 142 generating the primary pre-pulse laser beam 120-5 includes generating the primary pre-pulse laser beam 120-5 using a first seed laser 144-5 and a first amplifier chain 148-5, as described in connection with FIGS. 5D and 5F, and/or elsewhere herein. In some implementations, the first seed laser 144-5 and one or more second seed lasers 144-2, 144-6 that are used to generate the main-pulse laser beam 120-2 and the auxiliary pre-pulse laser beam 120-6 are different seed lasers, and the first amplifier chain 148-5 and one or more second amplifier chains 148-2, 148-6 that are used to generate the main-pulse laser beam 120-2 and the auxiliary pre-pulse laser beam 120-6 are different amplifier chains.

In a second implementation, alone or in combination with the first implementation, the laser source 142 generating the primary pre-pulse laser beam 120-5 and the auxiliary pre-pulse laser beam 120-6 respectively includes generating, using a first seed laser 144-1 and a first amplifier chain 148-1, a laser output 150-1 including a first wavelength to generate the primary pre-pulse laser beam 120-5 and generating, using a second seed laser, and splitting, using an optical component 504-2, the laser output 150-1 into a first portion and a second portion, as described in connection with FIGS. 5B and 5E, and/or elsewhere herein. In some implementations, the first portion is used to generate the primary pre-pulse laser beam 120-5.

In a third implementation, alone or in combination with one or more of the first and second implementations, the laser source 142 generating the primary pre-pulse laser beam 120-5 and the auxiliary pre-pulse laser beam 120-6 respectively includes generating, using a first seed laser 144-5 and a first amplifier chain 148-5, a first laser output 150-5 including a pulse wave to generate the primary pre-pulse laser beam 120-5 and generating, using a second seed laser 144-6 and a second amplifier chain 148-6, a second laser output 150-6 including a continuous wave to generate the auxiliary pre-pulse laser beam 120-6.

In a fourth implementation, alone or in combination with one or more of the first through third implementations, the laser source 142 generating the main-pulse laser beam 120-2 includes generating the main-pulse laser beam 120-2 using a first seed laser 144-2 and a first amplifier chain 148-2, as described in connection with FIGS. 5B and 5D, and/or elsewhere herein. In some implementations, the first seed laser 144-2 and one or more second seed lasers 144-5, 144-6 that are used to generate the primary pre-pulse laser beam 120-5 and the auxiliary pre-pulse laser beam 120-6 are different seed lasers, and the first amplifier chain 148-2 and one or more second amplifier chains 148-5, 148-6 that are used to generate the primary pre-pulse laser beam 120-5 and the auxiliary pre-pulse laser beam 120-6 are different amplifier chains.

In a fifth implementation, alone or in combination with one or more of the first through fourth implementations, the laser source 142 generating the auxiliary pre-pulse laser beam 120-6 includes generating the auxiliary pre-pulse laser beam 120-6 using a first seed laser 144-6 and a first amplifier chain 148-6, as described in connection with FIGS. 5D and 5F, and/or elsewhere herein. In some implementations, the first seed laser 144-6 and one or more second seed lasers 144-2, 144-5 that are used to generate the main-pulse laser beam 120-2 and the primary pre-pulse laser beam 120-5 are different seed lasers, and the first amplifier chain 148-6 and one or more second amplifier chains 148-2, 148-5 that are used to generate the main-pulse laser beam 120-2 and the primary pre-pulse laser beam 120-5 are different amplifier chains.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

Techniques described above may improve an intensity of, and an energy-distribution from, a laser source providing energy to a droplet of a target material. The techniques described herein reduce and/or minimize drive laser spatial and temporal beam profile non-uniformities, improve timing and intensity of modulation, and reduce impact of thermal effects. In this way, output intensity of the laser source and an operating efficiency of the laser source increases.

As described in greater detail above, some implementations described herein provide a method. The method includes generating a pre-pulse laser beam. The method includes providing, to an EUV radiation source, the pre-pulse laser beam to generate a deformed droplet from a droplet of a target material in a vessel of the EUV radiation source. The method includes generating a main-pulse laser beam having a first spatial energy-distribution profile. The method includes generating an auxiliary laser beam having a second spatial energy-distribution profile, where the second spatial energy-distribution profile is based on the first spatial energy-distribution profile to achieve a target spatial energy-distribution profile for a combination of the main-pulse laser beam and the auxiliary laser beam. The method includes providing, to the EUV radiation source, the main-pulse laser beam and the auxiliary laser beam to generate a plasma from the deformed droplet in the vessel of the EUV radiation source.

As described in greater detail above, some implementations described herein provide a method. The method includes receiving a semiconductor substrate coated with a photoresist material. The method includes exposing the semiconductor substrate to light generated by a plasma in an EUV radiation source. In some implementations, generating the plasma includes generating a pre-pulse laser beam having a first spatial energy-distribution profile and generating an auxiliary laser beam having a second spatial energy-distribution profile, where the second spatial energy-distribution profile is based on the first spatial energy-distribution profile to achieve a target spatial energy-distribution profile for a combination of the pre-pulse laser beam and the auxiliary laser beam. In some implementations the method includes providing, to the EUV radiation source, the pre-pulse laser beam and the auxiliary laser beam to generate a deformed droplet from a droplet of a target material in a vessel of the EUV radiation source. In some implementations, the method includes generating a main-pulse laser beam and providing, to the EUV radiation source, the main-pulse laser beam to generate the plasma from the deformed droplet in the vessel of the EUV radiation source.

As described in greater detail above, some implementations described herein provide a method. The method includes providing, by a controller and to a primary laser source associated with an EUV radiation source a first signal to cause the primary laser source to generate a first plurality of laser beams, where the first plurality of laser beams are to be used to generate, from a first plurality of droplets of a target material, a plasma within a vessel of the EUV radiation source. The method includes providing, by the controller and to the primary laser source, a second signal to deactivate the primary laser source after the first plurality of laser beams are generated. The method includes providing, by the controller and to an auxiliary laser source associated with the EUV radiation source, a third signal to cause the auxiliary laser source to generate a second plurality of laser beams to generate the plasma from a second plurality of droplets of the target material, where the third signal is to cause the auxiliary laser source to generate the second plurality of laser beams at least one of: concurrently with the primary laser source generating a subset of the first plurality of laser beams, or after the primary laser source finishes generating the first plurality of laser beams.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   generating a pre-pulse laser beam;
   providing, to an extreme ultraviolet (EUV) radiation source, the pre-pulse laser beam to generate a deformed droplet from a droplet of a target material in a vessel of the EUV radiation source;
   splitting a laser output into a first portion and a second portion;
   generating, based on the first portion, a main-pulse laser beam having a first spatial energy-distribution profile;
   generating, based on the second portion, an auxiliary laser beam having a second spatial energy-distribution profile,
      wherein the second spatial energy-distribution profile is based on the first spatial energy-distribution profile to achieve a target spatial energy-distribution profile for a combination of the main-pulse laser beam and the auxiliary laser beam; and
   providing, to the EUV radiation source, the main-pulse laser beam and the auxiliary laser beam to generate a plasma from the deformed droplet in the vessel of the EUV radiation source.

2. The method of claim 1, wherein generating the pre-pulse laser beam comprises:
   generating the pre-pulse laser beam using a first seed laser and a first amplifier chain,
      wherein the first seed laser and one or more second seed lasers that are used to generate the main-pulse laser beam and the auxiliary laser beam are different seed lasers, and
      wherein the first amplifier chain and one or more second amplifier chains that are used to generate the main-pulse laser beam and the auxiliary laser beam are different amplifier chains.

3. The method of claim 1, further comprising:
   generating, using a seed laser and an amplifier chain, the laser output,
      wherein the laser output is split into the first portion and the second portion using an optical component, and
      wherein the second portion is rotated using the optical component to generate the auxiliary laser beam.

4. The method of claim 1, wherein generating the auxiliary laser beam comprises:
   generating multiple auxiliary laser beams using multiple seed lasers and multiple corresponding amplifier chains; and
   combining the multiple auxiliary laser beams to generate the auxiliary laser beam.

5. The method of claim 1, wherein generating the main-pulse laser beam comprises:
   generating the main-pulse laser beam using a first seed laser and a first amplifier chain,
      wherein the first seed laser and one or more second seed lasers that are used to generate the pre-pulse laser beam and the auxiliary laser beam are different seed lasers, and
      wherein the first amplifier chain and one or more second amplifier chains that are used to generate the pre-pulse laser beam and the auxiliary laser beam are different amplifier chains.

6. The method of claim 1, wherein generating the auxiliary laser beam comprises:
   generating the auxiliary laser beam using a first seed laser and a first amplifier chain,
      wherein the first seed laser and one or more second seed lasers that are used to generate the main-pulse laser beam and the pre-pulse laser beam are different seed lasers, and
      wherein the first amplifier chain and one or more second amplifier chains that are used to generate the main-pulse laser beam and the pre-pulse laser beam are different amplifier chains.

7. The method of claim 1, wherein generating the main-pulse laser beam and generating the auxiliary laser beam respectively comprises:
   generating the main-pulse laser beam based on a first signal to activate the main-pulse laser beam at a first time and to deactivate the main-pulse laser beam at a second time; and
   generating the auxiliary laser beam based on a second signal to activate the auxiliary laser beam at a third time and to deactivate the auxiliary laser beam at a fourth time,
      wherein a first duration between the first time and the second time is different than a second duration between the third time and the fourth time.

8. A method, comprising:
   receiving a semiconductor substrate coated with a photoresist material; and
   exposing the semiconductor substrate to light generated by a plasma in an extreme ultraviolet (EUV) radiation source, wherein generating the plasma comprises:
      splitting a laser output into a first portion and a second portion;
      generating, based on the first portion, a pre-pulse laser beam having a first spatial energy-distribution profile;
      generating, based on the second portion, an auxiliary laser beam having a second spatial energy-distribution profile,
         wherein the second spatial energy-distribution profile is based on the first spatial energy-distribution profile to achieve a target spatial energy-distribution profile for a combination of the pre-pulse laser beam and the auxiliary laser beam;
      providing, to the EUV radiation source, the pre-pulse laser beam and the auxiliary laser beam to generate a deformed droplet from a droplet of a target material in a vessel of the EUV radiation source;
      generating a main-pulse laser beam; and
      providing, to the EUV radiation source, the main-pulse laser beam to generate the plasma from the deformed droplet in the vessel of the EUV radiation source.

9. The method of claim 8, wherein generating the pre-pulse laser beam comprises:
generating the pre-pulse laser beam using a first seed laser and a first amplifier chain,
wherein the first seed laser and one or more second seed lasers that are used to generate the main-pulse laser beam and the auxiliary laser beam are different seed lasers, and
wherein the first amplifier chain and one or more second amplifier chains that are used to generate the main-pulse laser beam and the auxiliary laser beam are different amplifier chains.

10. The method of claim 8, wherein generating the pre-pulse laser beam and generating the auxiliary laser beam respectively comprises:
generating, using a first seed laser and a first amplifier chain, a first laser output including a first wavelength to generate the pre-pulse laser beam; and
generating, using a second seed laser and a second amplifier chain, a second laser output including a second wavelength that is different than the first wavelength to generate the auxiliary laser beam.

11. The method of claim 8, wherein generating the pre-pulse laser beam and generating the auxiliary laser beam respectively comprises:
generating, using a first seed laser and a first amplifier chain, a first laser output including a pulse wave to generate the pre-pulse laser beam; and
generating, using a second seed laser and a second amplifier chain, a second laser output including a continuous wave to generate the auxiliary laser beam.

12. The method of claim 8, wherein generating the main-pulse laser beam comprises:
generating the main-pulse laser beam using a first seed laser and a first amplifier chain,
wherein the first seed laser and one or more second seed lasers that are used to generate the pre-pulse laser beam and the auxiliary laser beam are different seed lasers, and
wherein the first amplifier chain and one or more second amplifier chains that are used to generate the pre-pulse laser beam and the auxiliary laser beam are different amplifier chains.

13. The method of claim 8, wherein generating the auxiliary laser beam comprises:
generating the auxiliary laser beam using a first seed laser and a first amplifier chain,
wherein the first seed laser and one or more second seed lasers that are used to generate the main-pulse laser beam and the pre-pulse laser beam are different seed lasers, and
wherein the first amplifier chain and one or more second amplifier chains that are used to generate the main-pulse laser beam and the pre-pulse laser beam are different amplifier chains.

14. A method, comprising:
providing, by a controller and to a primary laser source associated with an extreme ultraviolet (EUV) radiation source, a first signal to cause the primary laser source to generate a first plurality of laser beams,
wherein the first plurality of laser beams are to be used to generate, from a first plurality of droplets of a target material, a plasma within a vessel of the EUV radiation source;
providing, by the controller and to the primary laser source, a second signal to deactivate the primary laser source after the first plurality of laser beams are generated; and
providing, by the controller and to an auxiliary laser source associated with the EUV radiation source, a third signal to cause the auxiliary laser source to generate a second plurality of laser beams to generate the plasma from a second plurality of droplets of the target material,
wherein the third signal is to cause the auxiliary laser source to generate the second plurality of laser beams at least one of:
concurrently with the primary laser source generating a subset of the first plurality of laser beams, or
after the primary laser source finishes generating the first plurality of laser beams.

15. The method of claim 14, wherein providing the second signal to deactivate the primary laser source comprises:
providing the second signal to deactivate the primary laser source based on a timing offset; and
wherein providing the third signal to cause the auxiliary laser source to generate the second plurality of laser beams comprises:
providing the third signal to cause the auxiliary laser source to generate the second plurality of laser beams based on the timing offset.

16. The method of claim 14, wherein providing the second signal to deactivate the primary laser source and providing the third signal to cause the auxiliary laser source to generate the second plurality of laser beams comprises:
detecting a degradation of a power intensity of the first plurality of laser beams; and
providing, based on detecting the degradation of the power intensity:
the second signal to deactivate the primary laser source, and
the third signal to cause the auxiliary laser source to generate the second plurality of laser beams.

17. The method of claim 14, further comprising:
providing a fourth signal to deactivate the auxiliary laser source after the second plurality of laser beams are generated; and
providing a fifth signal to cause the primary laser source to generate a third plurality of laser beams to generate the plasma from a third plurality droplets of the target material,
wherein the fifth signal is to cause the primary laser source to generate the third plurality of laser beams at least one of:
concurrently with the auxiliary laser source generating a subset of the second plurality of laser beams, or
after the auxiliary laser source finishes generating the second plurality of laser beams.

18. The method of claim 14, further comprising:
determining a correlation between a power intensity and a temperature of:
the primary laser source, or
the auxiliary laser source; and
providing information relating to the correlation to update a machine-learning model that estimates a time window to toggle between the primary laser source and the auxiliary laser source to maintain an output of the EUV radiation source to satisfy a threshold.

19. The method of claim 14, wherein the first plurality of laser beams and the second plurality of laser beams respectively provide energy to the first plurality of droplets and energy to the second plurality of droplets as part of a pre-pulse process that shapes the first plurality of droplets and the second plurality of droplets as part of generating the plasma.

20. The method of claim 14, wherein the first plurality of laser beams and the second plurality of laser beams respectively provide energy to the first plurality of droplets and energy to the second plurality of droplets as part of a main-pulse process that vaporizes and ionizes the first plurality of droplets and the second plurality of droplets as part of generating the plasma.

* * * * *